(12) United States Patent
Lee et al.

(10) Patent No.: US 12,170,309 B2
(45) Date of Patent: Dec. 17, 2024

(54) DISPLAY DEVICE AND METHOD FOR MANUFACTURING SAME

(71) Applicant: Samsung Display Co., LTD., Yongin-si (KR)

(72) Inventors: Won Jun Lee, Hwaseong-si (KR); Chol Ho Kim, Suwon-si (KR); Hong Bo Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 361 days.

(21) Appl. No.: 17/765,296

(22) PCT Filed: Jun. 5, 2020

(86) PCT No.: PCT/KR2020/007364
§ 371 (c)(1),
(2) Date: Mar. 30, 2022

(87) PCT Pub. No.: WO2021/066287
PCT Pub. Date: Apr. 8, 2021

(65) Prior Publication Data
US 2022/0352252 A1 Nov. 3, 2022

(30) Foreign Application Priority Data
Oct. 1, 2019 (KR) .......................... 10-2019-0121557

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/24* (2013.01); *H01L 33/44* (2013.01)

(58) Field of Classification Search
CPC ... H01L 25/167; H01L 27/12; H01L 27/1218; H01L 27/124; H01L 27/1259;
(Continued)

(56) References Cited

U.S. PATENT DOCUMENTS 10,608,017 B2   3/2020  Takahashi et al.
2014/0327035 A1 11/2014 Itoh
(Continued)

FOREIGN PATENT DOCUMENTS

CN   107527933   12/2017
CN   110676262   1/2020
(Continued)

OTHER PUBLICATIONS

International Search Report, with English translation, corresponding to International Application No. PCT/ KR2020/007364 dated Sep. 24, 2020.
(Continued)

*Primary Examiner* — Brook Kebede
(74) *Attorney, Agent, or Firm* — KILE PARK REED & HOUTTEMAN PLLC

(57) ABSTRACT

A display device comprises a display area, a non-display area surrounding the display area, pixels disposed in the display area of the substrate, each of the pixels including a first electrode, a second electrode, and light-emitting elements electrically connected to the first electrode and the second electrode, and a first voltage wiring disposed in the display area and the non-display area, the first voltage wiring electrically connected to at least some of the pixels. The first voltage wiring includes a first separation wiring disposed in the non-display area, and a second separation wiring disposed in the non-display area and spaced apart from the first separation wiring.

20 Claims, 26 Drawing Sheets

(51) Int. Cl.
    *H01L 33/24*     (2010.01)
    *H01L 33/44*     (2010.01)
(58) Field of Classification Search
    CPC . H01L 27/156; H01L 33/0045; H01L 33/005;
        H01L 33/0095; H01L 33/24; H01L 33/44
    See application file for complete search history.

(56) References Cited

U.S. PATENT DOCUMENTS

| 2016/0216590 A1 | 7/2016 | Kimura |
| 2016/0365398 A1 | 12/2016 | Kim et al. |
| 2019/0043938 A1 | 2/2019 | Lee et al. |

FOREIGN PATENT DOCUMENTS

| JP | 2010-176013 | 8/2010 | |
| JP | 2011-211047 | 10/2011 | |
| KR | 10-2001-0021025 | 3/2001 | |
| KR | 10-2012-0120377 | 11/2012 | |
| KR | 10-2014-0062369 | 5/2014 | |
| KR | 10-2015-0006798 | 1/2015 | |
| KR | 10-2016-0006339 | 1/2016 | |
| KR | 10-2016-0059569 | 5/2016 | |
| KR | 10-2016-0081241 | 7/2016 | |
| KR | 10-2017-0000063 | 1/2017 | |
| KR | 2017000063 A * | 1/2017 | ......... H01L 27/3248 |
| KR | 10-2018-0061565 | 6/2018 | |
| KR | 10-2018-0072909 | 7/2018 | |
| KR | 2018072909 A * | 7/2018 | ......... H01L 25/0753 |
| KR | 10-2018-0089293 | 8/2018 | |
| KR | 10-2019-0041553 | 4/2019 | |
| KR | 10-2019-0068084 | 6/2019 | |

OTHER PUBLICATIONS

Written Opinion, with English translation, corresponding to International Application No. PCT/KR2020/007364, dated Sep. 24, 2020.

* cited by examiner

DISPLAY DEVICE AND METHOD FOR MANUFACTURING SAME

CROSS-REFERENCE TO RELATED APPLICATION(S)

This application is a national entry of International Application No. PCT/KR2020/007364, filed on Jun. 5, 2020, which claims under 35 U.S.C. § 119(a) and 365(b) priority to and benefits of Korean Patent Application No. 10-2019-0121557, filed on Oct. 1, 2019, in the Korean Intellectual Property Office, the entire contents of which are incorporated herein by reference.

BACKGROUND

1. Technical Field

The disclosure relates to a display device and a method for manufacturing same.

2. Description of the Related Art

The importance of display devices has steadily increased with the development of multimedia technology. In response, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a method for manufacturing a display device including pixels including light-emitting elements, in which the pixels disposed in different areas are distinguished to align the light-emitting elements for each area.

It should be noted that aspects of the disclosure are not limited thereto and other aspects, which are not mentioned herein, will be apparent to those of ordinary skill in the art from the following description.

According to an embodiment of the disclosure, a display device may comprise a display area, a non-display area surrounding the display area, pixels disposed in the display area, each of the pixels comprising a first electrode, a second electrode and light-emitting elements electrically connected to the first electrode and to the second electrode, and a first voltage wiring disposed in the display area and the non-display area, the first voltage wiring electrically connected to at least some of the pixels. The first voltage wiring may include a first separation wiring disposed in the non-display area, and a second separation wiring disposed in the non-display area, and spaced apart from the first separation wiring.

The display area may comprise a first display area and a second display area. The first separation wiring may comprise a first wiring stem part disposed in the non-display area and extending in a first direction, and a first wiring branch part branching from the first wiring stem part in a second direction and disposed in the first display area. The second separation wiring may comprise a second wiring stem part disposed in the non-display area and extending in the first direction, and a second wiring branch part branching from the second wiring stem part in the second direction and disposed in the second display area.

The display device may further comprise a first switching transistor which is disposed between the first wiring stem part and the second wiring stem part. The first wiring stem part and the second wiring stem part may be spaced apart from each other in the non-display area, and the The first switching transistor may include a first source/drain electrode electrically connected to the first separation wiring, and a second source/drain electrode electrically connected to the second separation wiring.

The first switching transistor may be turned on in a driving mode of the display device, and may be turned off in a manufacturing mode of the display device.

The first wiring branch part may be electrically connected to the second electrodes of the pixels disposed in the first display area. The second wiring branch part may be electrically connected to the second electrodes of the pixels disposed in the second display area.

The display device may further comprise a second electrode wiring disposed in the non-display area, the second electrode wiring extending in the second direction. The second electrodes of the pixels may extend in the second direction and may be electrically connected to the second electrode wiring.

The second electrode wiring may comprise wirings separated from each other in the non-display area.

The wirings may be electrically connected to the first switching transistor.

The display device may further comprise a first electrode wiring disposed in the non-display area, the first electrode wiring extending in the first direction. The first electrode disposed in each of the pixels may not be electrically connected to the first electrode wiring.

The display device may further comprise a pad area disposed in the non-display are. The first separation wiring may be electrically connected to a first power pad disposed in the pad area. The second separation wiring may be electrically connected to a second power pad disposed in the pad area.

According to an embodiment of the disclosure, a display device may comprise pixels, each of the pixels comprising a first electrode, a second electrode and light-emitting elements disposed between the first electrode and the second electrode, a first voltage wiring comprising a first separation wiring and a second separation wiring, the first separation wiring and the second separation wiring separated from each other, and a first switching transistor disposed between the first separation wiring and the second separation wiring, the first switching transistor including source/drain electrodes electrically connected to the first separation wiring and the second separation wiring, respectively. The pixels may comprise a first type pixel in which the second electrode is electrically connected to the first separation wiring, and a second type pixel in which the second electrode is electrically connected to the second separation wiring.

In a first manufacturing mode, the first switching transistor may be turned off. In the first manufacturing mode, an alignment signal may be transmitted to the first separation wiring and to the second electrode of the first type pixel. In the first manufacturing mode, the alignment signal may not be transmitted to the second separation wiring, and may be not transmitted to the second electrode of the second type pixel.

In a second manufacturing mode, the first switching transistor may be turned off. In the second manufacturing mode, an alignment signal may be transmitted to the second separation wiring and to the second electrode of the second type pixel. In the second manufacturing mode, the alignment signal may not be transmitted to the first separation wiring, and may be not transmitted to the second electrode of the first type pixel.

In a driving mode, the first switching transistor may be turned on. In the driving mode, a power supply voltage may be transmitted to the first separation wiring and to the second electrode of the first type pixel. In the driving mode, the power supply voltage may be transmitted to the second separation wiring and to and the second electrode of the second type pixel.

According to an embodiment of the disclosure, a method for manufacturing a display device may comprise preparing a first voltage wiring on a substrate, the first voltage wiring including a first separation wiring and a second separation wiring that each receive a first alignment signal, a first electrode that receives a second alignment signal, and second electrodes, each of the second electrodes electrically connected to the first separation wiring, or to the second separation wiring, aligning a first light-emitting element between the first electrode and one of the second electrodes electrically connected to the first separation wiring by transmitting the first alignment signal to the first separation wiring, and aligning a second light-emitting element between the first electrode and one of the second electrodes electrically connected to the second separation wiring by transmitting the first alignment signal to the second separation wiring.

The first separation wiring may be disposed in a first display area of the display device. The second separation wiring may be disposed in a second display area of the display device.

The first light-emitting element may be aligned between the first electrode and one of the second electrodes disposed in the first display area of the display device. The second light-emitting element may be aligned between the first electrode and one of the second electrodes disposed in the second display area of the display device.

The method for manufacturing a display device may further comprise preparing a first switching transistor which has source/drain electrodes electrically connected to the first separation wiring and the second separation wiring, respectively. The first separation wiring and the second separation wiring may be spaced apart from each other.

The first switching transistor may be turned off in the aligning of the first light-emitting elements, and in the aligning of the second light-emitting element.

The details of other embodiments are included in the detailed description and the accompanying drawings.

In a method for manufacturing a display device according to an embodiment, an alignment signal may be transmitted to each of different display areas using wirings separated from each other. Accordingly, even if the display device includes a large number of pixels, an alignment signal of uniform strength may be transmitted to all of the pixels.

In an embodiment, the display device may include a switching transistor disposed between wirings separated from each other. The switching transistor may be turned off in a manufacturing mode of the display device and may be turned on in a driving mode. In the display device, even if a power supply voltage is applied through the wirings separated from each other, a uniform power supply voltage may be applied to the entire display device because the switching transistor may be kept turned on.

The effects according to the embodiments are not limited by the contents above, and other effects are included in this disclosure.

BRIEF DESCRIPTION OF DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
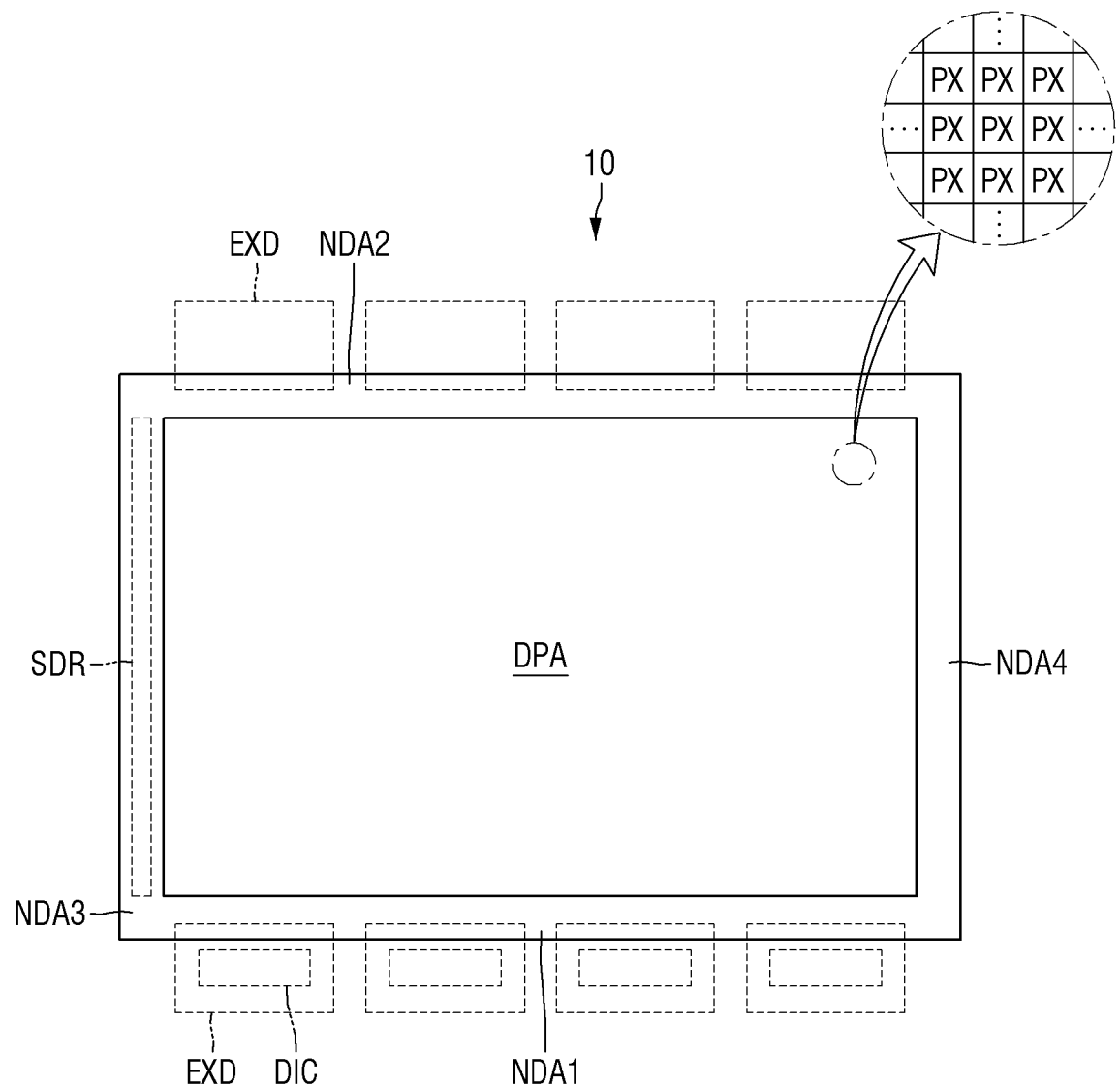
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on," "connected to," or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an electrode is referred to as a "source/drain" electrode, it may be either of a source or a drain electrode.

Hereinafter, embodiments will be described with reference to the accompanying drawings.

FIG. 1 is a schematic plan view of a display device according to an embodiment.

Referring to FIG. 1, the display device 10 displays moving images or still images. The display device 10 may refer to an electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, and camcorders, all of which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. An inorganic light emitting diode display panel is illustrated as an example of the display panel will be described below, but the disclosure is not limited to this, and other display panels can also be used as long as the same technical spirit is applicable.

The shape of the display device 10 can be modified. For example, the display device 10 may have various shapes such as a horizontally long rectangle, a vertically long rectangle, a square, a quadrangle with rounded corners (vertices), other polygons, or a circle. The shape of a display area DPA of the display device 10 may also be similar to the overall shape of the display device 10. In FIG. 1, the display device 10 and the display area DPA have a horizontally long rectangular shape.

The display device 10 may include the display area DPA and a non-display area NDA. The display area DPA is an area where a screen can be displayed, and the non-display area NDA is an area where no screen is displayed. The display area DPA may also be referred to as an active area, and the non-display area NDA may also be referred to as an inactive area. The display area DPA may generally occupy the center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombus shape having each side inclined with respect to a direction. The pixels PX may be alternately arranged in a stripe type or a PENTILE™ type. Each of the pixels PX may display a color by including one or more light-emitting elements 300 which emit light of a wavelength band.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. The non-display area NDA may include a first non-display area NDA1 located below the display area DPA, a second non-display area NDA2 located above the display area DPA, a third non-display area NDA3 located to the left of the display area DPA, and a fourth non-display area NDA4 located to the right of the display area DPA. In each non-display area NDA, wirings or circuit drivers DIC (or a scan driver SDR) included in the display device 10 may be disposed, or external devices EXD may be mounted.

Figure 2:
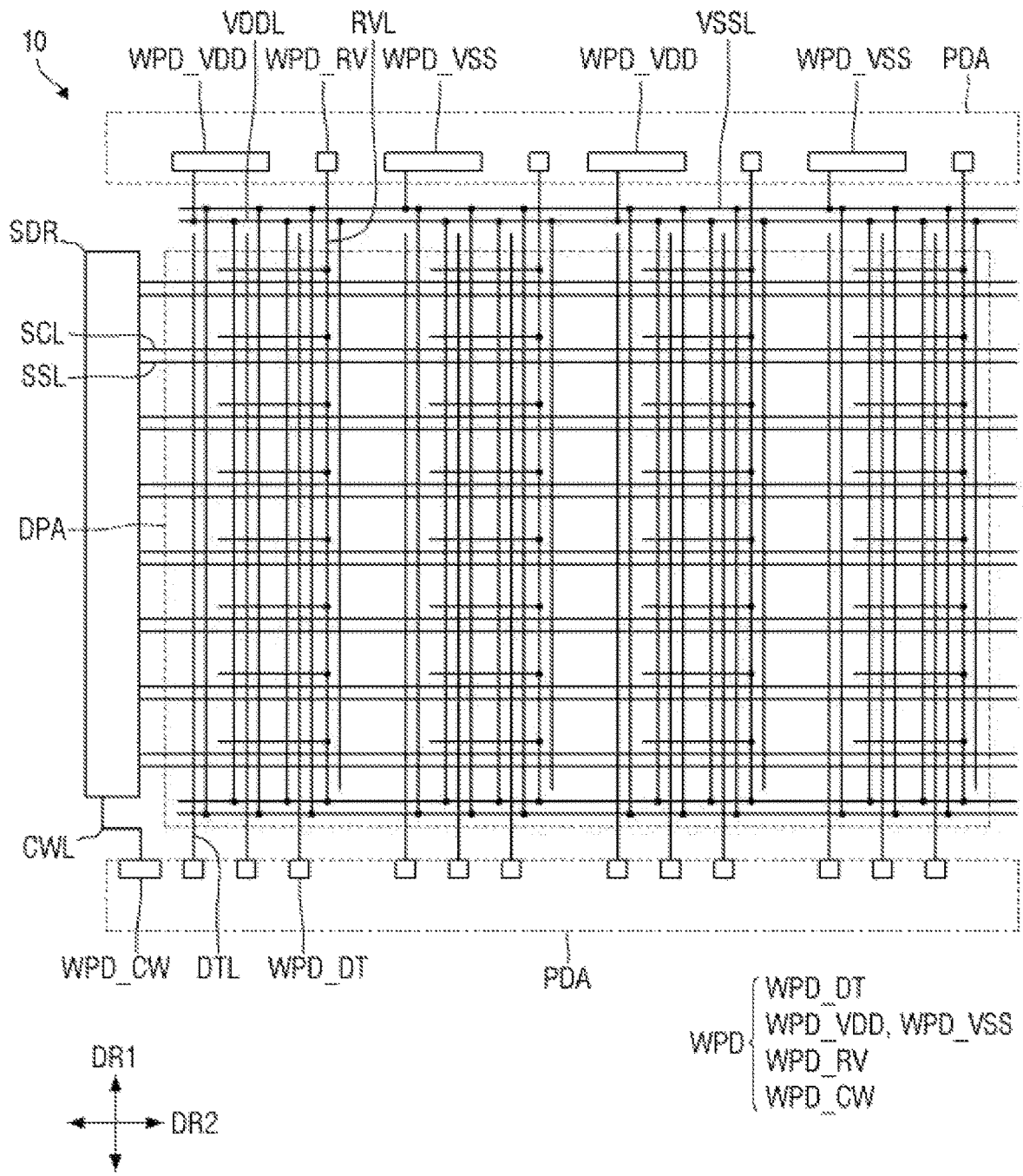
FIG. 2 is a schematic plan view illustrating wirings included in the display device according to an embodiment.

FIG. 2 is a schematic plan view illustrating wirings included in the display device according to the embodiment.

Referring to FIG. 2, the display device 10 may include wirings. The wirings may include scan lines SCL, sensing lines SSL, data lines DTL, reference voltage wirings RVL, a first voltage wiring VSSL, and a second voltage wiring VDDL. Other wirings, not illustrated in the drawing, may be further disposed in the display device 10.

The scan lines SCL and the sensing lines SSL may extend in a second direction DR2. The scan lines SCL and the sensing lines SSL may be electrically connected to a scan driver SDR. The scan driver SDR may include a driving circuit. The scan driver SDR may be disposed in the third non-display area NDA3 located on a side of the display area DPA in the second direction DR2, but the disclosure is not limited thereto. The scan driver SDR may be electrically connected to a signal connection wiring CWL, and at least one end of the signal connection wiring CWL may form a pad WPD_CW in the non-display area NDA and thus may be electrically connected to an external device.

The data lines DTL and the reference voltage wirings RVL may extend in a first direction DR1 intersecting the second direction DR2. Each of the reference voltage wirings RVL may further include parts branching in the second direction DR2 from a part extending in the first direction DR1. Each of the first voltage wiring VSSL and the second voltage wiring VDDL may also include parts extending in the first direction DR1. Each of the first voltage wiring VSSL and the second voltage wiring VDDL may further include parts extending in the second direction DR2. Accordingly, each of the first voltage wiring VSSL and the second voltage wiring VDDL may have a mesh structure. However, the disclosure is not limited thereto. In some embodiments, in each of the first voltage wiring VSSL and the second voltage wiring VDDL, the parts extending in the first direction DR1 may omit the parts located below the display area DPA. Each of the pixels PX of the display device 10 may be electrically connected to at least one data line DTL, a reference voltage wiring RVL, the first voltage wiring VSSL, and the second voltage wiring VDDL that are not included in the drawings.

The data lines DTL, the reference voltage wirings RVL, the first voltage wiring VSSL, and the second voltage wiring VDDL may be electrically connected to at least one wiring pad WPD. Each wiring pad WPD may be disposed in the non-display area NDA. In an embodiment, wiring pads WPD_DT (hereinafter, referred to as 'data pads') of the data lines DTL may be disposed in the first non-display area NDA1 located on a side of the display area DPA in the first direction DR1, and wiring pads WPD_RV (hereinafter, referred to as 'reference voltage pads') of the reference voltage wirings RVL, wiring pads WPD_VSS (hereinafter, referred to as 'first power pads') of the first voltage wiring VSSL and wiring pads WPD_VDD (hereinafter, referred to as 'second power pads') of the second voltage wiring VDDL may be disposed in the second non-display area NDA2 located on the other side of the display area DPA in the first direction DR1. For example, the data pads, the reference voltage pads, and the power pads may be disposed in the pad areas PDA. In another example, the data pads WPD_DT, the reference voltage pads WPD_RV, the first power pads WPD_VSS, and the second power pads WPD_VDD may all be disposed in the same area, for example, in the non-display area NDA located above the display area DPA (a single pad area PDA). The external devices EXD may be mounted on the wiring pads WPD as described above. The external devices EXD may be mounted on the wiring pads WPD through an anisotropic conductive film, ultrasonic bonding, or the like.

In the drawing, a part of the first voltage wiring VSSL which extends in the second direction DR2 may cover the display area DPA. However, according to an embodiment, in the display device 10, the first voltage wiring VSSL may include multiple voltage wirings, and the voltage wirings may be disposed in the non-display area NDA to extend in the second direction DR2 but may each cover only a part of the display area DPA. For example, a part of the first voltage wiring VSSL which extends in the second direction DR2 may be separated into two or more wirings. During a manufacturing process of the display device 10, an alignment signal may be transmitted only to some voltage wirings of the first voltage wiring VSSL, and the alignment signal may form an electric field only in the portion of display area DPA covered by the voltage wirings. Therefore, by forming an electric field in a portion of the display device 10 at a time, an electric field of uniform strength may be maintained in a large display area DPA. This will be described in more detail below with reference to other drawings.

Each pixel PX (refer to FIG. 1) of the display device 10 may include a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit can be variously changed. Although the pixel driving circuit will be described below using a 3T1C structure including three transistors and one capacitor as an example, the disclosure is not limited thereto, and other various modified pixel structures such as a 2T1C structure, a 7T1C structure, and a 6T1C structure are also applicable.

Figure 3:
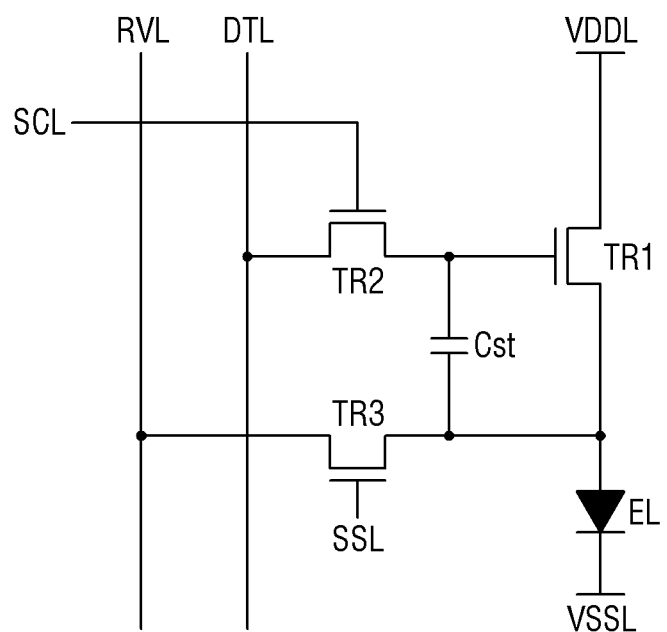
FIG. 3 is a schematic diagram of an equivalent circuit of a pixel included in the display device according to an embodiment.

FIG. 3 is schematic diagram of an equivalent circuit of a pixel included in the display device according to the embodiment.

Referring to FIG. 3, each pixel PX of the display device according to the embodiment may include three transistors TR1 through TR3, a storage capacitor Cst, and a light emitting diode EL.

The light emitting diode EL may emit light according to a current supplied through a first transistor TR1. The light emitting diode EL may include a first electrode, a second electrode, and a light-emitting element 300 (refer to FIG. 4) disposed between them. The light-emitting element 300 may emit light of a wavelength band in response to electrical signals received from the first electrode and the second electrode.

An end of the light emitting diode EL may be electrically connected to a first source/drain electrode of the first transistor TR1, and the other end may be electrically connected to a first voltage wiring VSSL to which a low potential voltage (a first power supply voltage VSS) lower than a high potential voltage (a second power supply voltage VDD) of a second voltage wiring VDDL is supplied.

The first transistor TR1 adjusts a current flowing from the second voltage wiring VDDL, to which the first power supply voltage is supplied, to the light emitting diode EL according to a voltage difference between a gate electrode and the source electrode. The first transistor TR1 may have the gate electrode electrically connected to a first source/drain electrode of a second transistor TR2, the first source/drain electrode electrically connected to the first electrode of the light emitting diode EL, and a second source/drain electrode electrically connected to the second voltage wiring VDDL to which the second power supply voltage VDD is applied.

The second transistor TR2 is turned on by a scan signal of a scan line SCL to electrically connect a data line DTL to the gate electrode of the first transistor TR1. The second transistor TR2 may include a gate electrode electrically connected to the scan line SCL, the first source/drain electrode electrically connected to the gate electrode of the first transistor TR1, and a second source/drain electrode electrically connected to the data line DTL.

A third transistor TR3 is turned on by a sensing signal of a sensing line SSL to electrically connect a reference voltage wiring RVL to the first source/drain electrode of the first transistor TR1. The third transistor TR3 may have a gate electrode electrically connected to the sensing line SSL, a first source/drain electrode electrically connected to the reference voltage wiring RVL, and a second source/drain electrode electrically connected to the first source/drain electrode of the first transistor TR1.

In an embodiment, the first electrode of each of the first through third transistors TR1 through TR3 may be a source electrode, and the second electrode may be a drain electrode. However, the disclosure is not limited thereto, and the opposite may also be used.

The capacitor Cst may be formed between the gate electrode and the first source/drain electrode of the first transistor TR1. The storage capacitor Cst stores a voltage difference between a gate voltage and a first source/drain voltage of the first transistor TR1.

Each of the first through third transistors TR1 through TR3 may be formed as a thin-film transistor. Although each of the first through third transistors TR1 through TR3 is described as an N-type metal oxide semiconductor field effect transistor (MOSFET) in FIG. 3, the disclosure is not limited thereto. For example, each of the first through third transistors TR1 through TR3 may also be formed as a P-type MOSFET, or some of the first through third transistors TR1 through TR3 may be formed as N-type MOSFETs, and the other may be formed as a P-type MOSFET.

The structure of a pixel PX of the display device 10 according to the embodiment will now be described in detail with further reference to other drawings.

Figure 4:
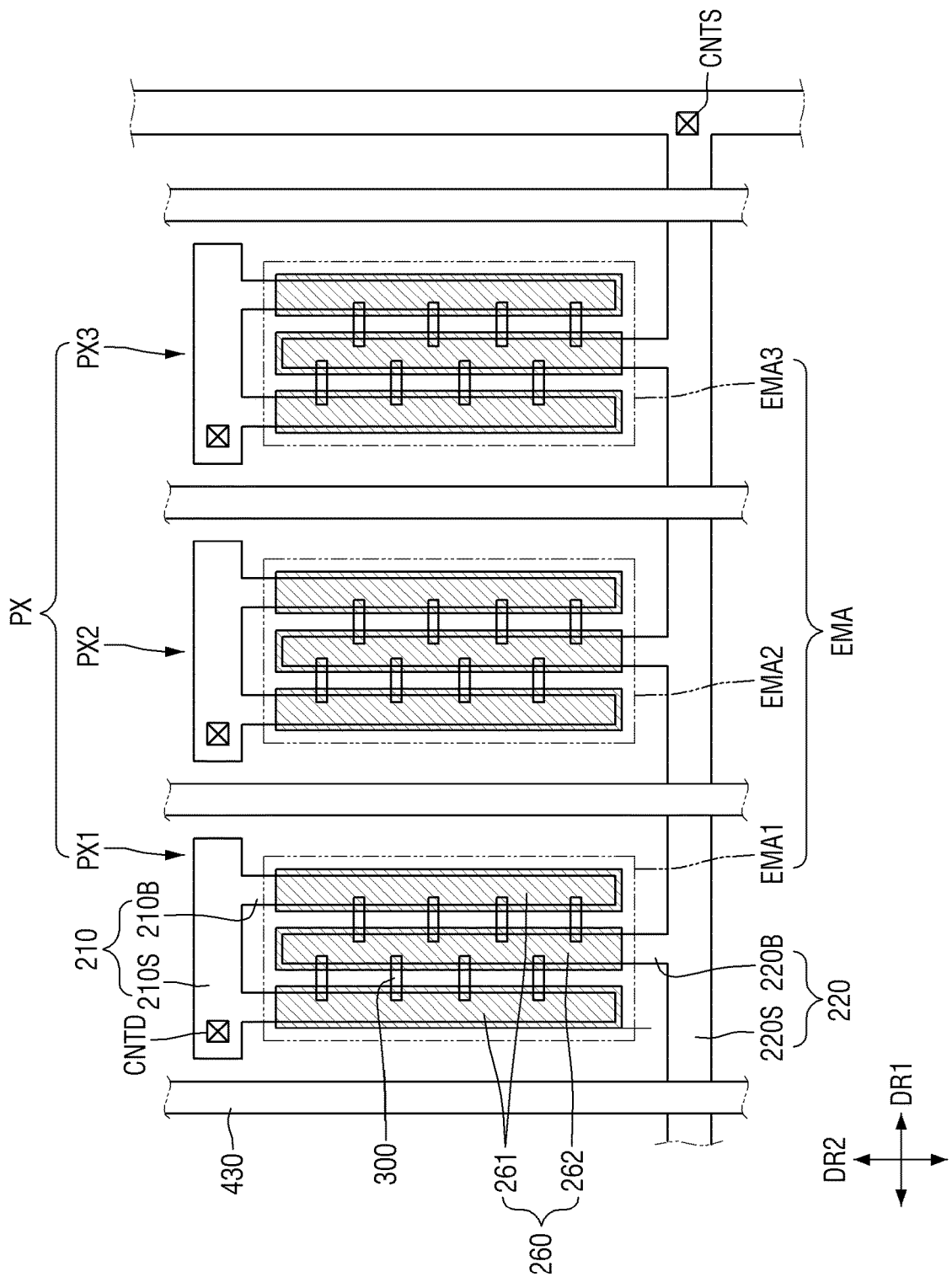
FIG. 4 is a schematic plan view of a pixel of the display device according to an embodiment.
Figure 5:
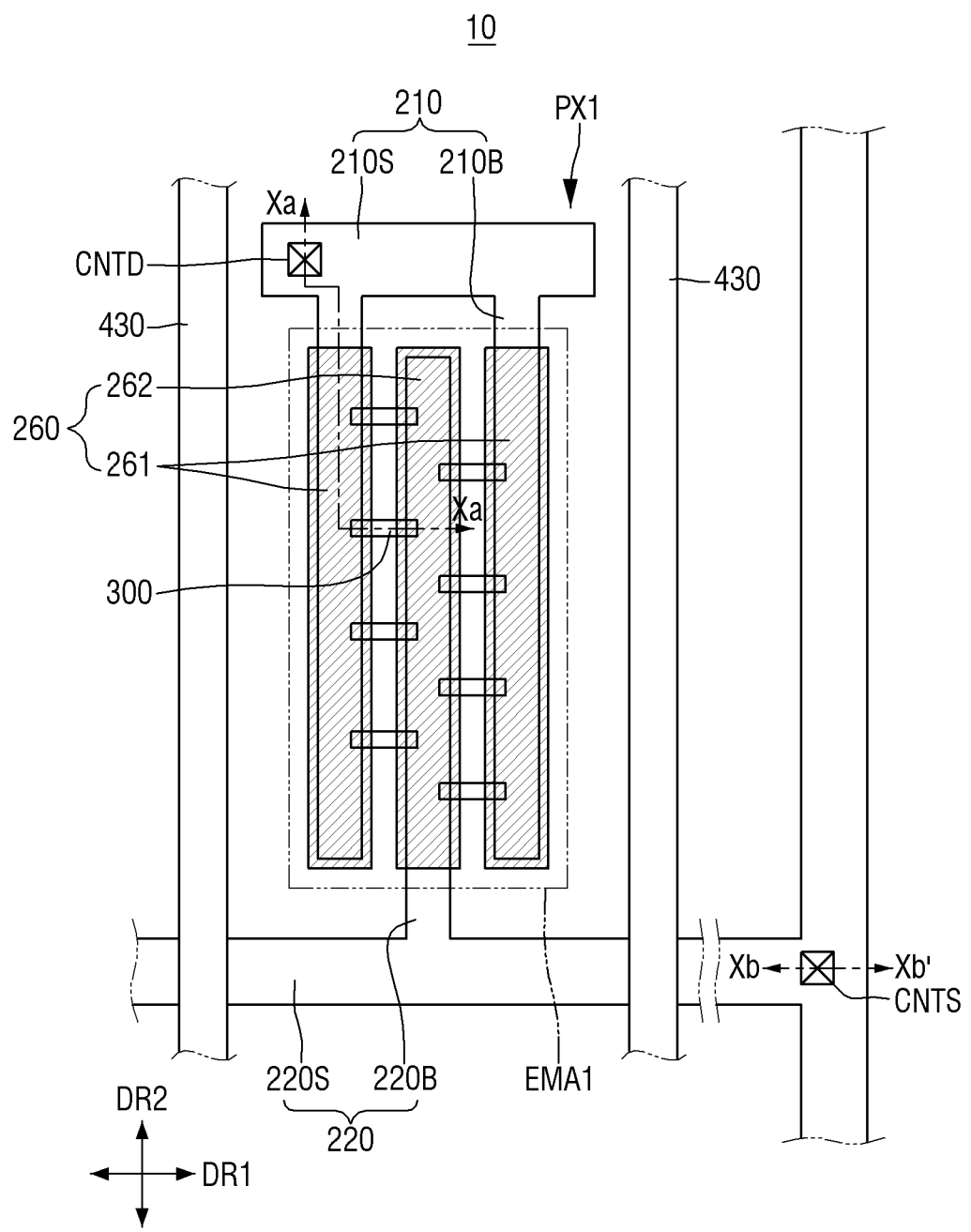
FIG. 5 is a schematic layout view of a subpixel of FIG. 4.
Figure 6:
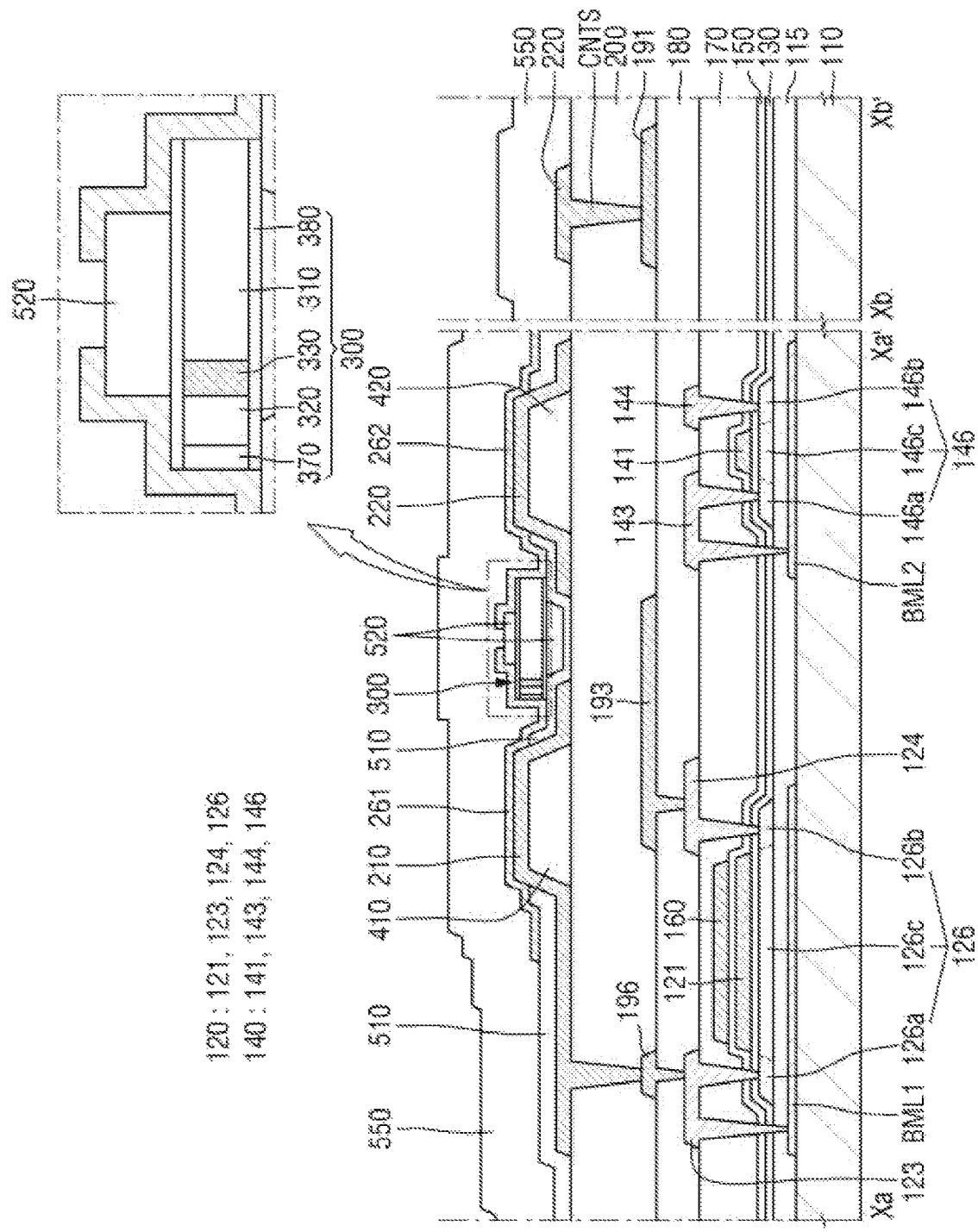
FIG. 6 is a schematic cross-sectional view taken along lines Xa-Xa' and Xb-Xb' of FIG. 5.

FIG. 4 is a schematic plan view of a pixel of the display device according to the embodiment. FIG. 5 is a schematic plan view of a subpixel of FIG. 4. FIG. 6 is a schematic cross-sectional view taken along lines Xa-Xa' and Xb-Xb' of FIG. 5.

Referring to FIGS. 4 through 6, each of the pixels PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be blue, the second color may be green, and the third color may be red. However, the disclosure is not limited thereto, and each subpixel PXn may also emit light of the same color. Although a pixel PX includes three subpixels SPXn in FIG. 4, the disclosure is not limited thereto, and the pixel PX may also include a larger number of subpixels PXn.

Each subpixel PXn of the display device 10 may include an emission area EMA. The first subpixel PX1 may include a first emission area EMA1, the second subpixel PX2 may include a second emission area EMA2, and the third subpixel PX3 may include a third emission area EMA2. The emission area EMA may be defined as an area where light-emitting elements 300 included in the display device 10 are disposed to emit light of a wavelength band. Each of the light-emitting elements 300 may include an active layer 330 (refer to FIG. 7), and the active layer 330 may emit light of a wavelength band without directionality. Light emitted from the active layer 330 of each light-emitting element 300 may be radiated in a lateral direction of the light-emitting element 300 as well as toward both ends of the light-emitting element 300. The emission area EMA may include an area in which the light-emitting elements 300 are disposed and an area which is adjacent to the light-emitting elements 300 and from which light emitted from the light-emitting elements 300 is output.

However, the disclosure is not limited thereto, and the emission area EMA may also include an area from which light emitted from the light-emitting elements 300 is output after being reflected or refracted by other members. Light-emitting elements 300 may be disposed in each subpixel PXn, and an area where the light-emitting elements 300 are disposed and an area adjacent to this area may form the emission area EMA.

Although not illustrated in the drawings, each subpixel PXn of the display device 10 may include a non-emission area defined as an area other than the emission area EMA. The non-emission area may be an area in which the light-emitting elements 300 are not disposed and from which no light is output because light emitted from the light-emitting elements 300 does not reach this area.

FIG. 6 illustrates a schematic cross section of the first subpixel PX1 of FIG. 5, but the same illustration may be applied to other pixels PX or subpixels PXn. FIG. 6 also illustrates a schematic cross section across a light-emitting element 300 disposed in the first subpixel PX1 of FIG. 5.

The display device 10 may include a circuit element layer and a display element layer disposed on a substrate 110. A semiconductor layer, conductive layers, and insulating layers may be disposed on the substrate 110 and may constitute the circuit element layer and the display element layer, respectively. The conductive layers may include a first gate conductive layer, a second gate conductive layer, a first data conductive layer and a second data conductive layer which are disposed under a first planarization layer 200 and constitute the circuit element layer and electrodes and contact electrodes which are disposed on the first planarization layer 200 and constitute the display element layer. The insulating layers may include a buffer layer 115, a first gate insulating layer 130, a first passivation layer 150, a first interlayer insulating layer 170, a second interlayer insulating layer 180, the first planarization layer 200, a first insulating layer 510, a second insulating layer 520, a third insulating layer 550, etc.

The circuit element layer may include a first transistor 120, a second transistor 140, a conductive pattern 196 and voltage wirings 191 and 193 as circuit elements and wirings for driving the light-emitting elements 300, and the display element layer may include a first electrode 210, a second electrode 220, a first contact electrode 261, and a second contact electrode 262 as well as the light-emitting elements 300.

The substrate 110 may be an insulating substrate. The substrate 110 may be made of an insulating material such as glass, quartz, or polymer resin. The substrate 110 may be a rigid substrate, but may also be a flexible substrate that can be bent, folded, rolled, etc.

Light blocking layers BML1 and BML2 may be disposed on the substrate 110. The light blocking layers BML1 and BML2 may include a first light blocking layer BML1 and a second light blocking layer BML2. The first light blocking layer BML1 and the second light blocking layer BML2 are overlapped by a first active material layer 126 of the first transistor 120 and a second active material layer 146 of the second transistor 140, respectively. The first and second light blocking layers BML1 and BML2 may include a light blocking material to prevent light from entering the first and second active material layers 126 and 146. For example, the first and second light blocking layers BML1 and BML2 may be made of an opaque metal material that blocks transmission of light. However, the disclosure is not limited thereto. In some examples, the light blocking layers BML1 and BML2 may be omitted. Although not illustrated in the drawings, the first light blocking layer BML1 may be electrically connected to a first source/drain electrode 123 of the first transistor 120 which will be described below, and the second light blocking layer BML2 may be electrically connected to a first source/drain electrode 143 of the second transistor 140.

The buffer layer 115 may be entirely disposed on the substrate 110 as well as the light blocking layers BML1 and BML2. The buffer layer 115 may be disposed on the substrate 110 to protect the transistors 120 and 140 of the pixels PX from moisture introduced through the substrate 110 which is vulnerable to moisture penetration and may perform a surface planarization function. The buffer layer 115 may be composed of inorganic layers stacked alternately. For example, the buffer layer 115 may be a multilayer in which one or more inorganic layers selected from a silicon oxide (SiOx) layer, a silicon nitride (SiNx) layer, and a silicon oxynitride (SiOxNy) layer are alternately stacked.

The semiconductor layer is disposed on the buffer layer 115. The semiconductor layer may include the first active material layer 126 of the first transistor 120 and the second active material layer 146 of the second transistor 140. These layers may be partially overlapped by gate electrodes 121 and 141 of the first gate conductive layer which will be described below.

In an embodiment, the semiconductor layer may include polycrystalline silicon, monocrystalline silicon, an oxide semiconductor, or the like. The polycrystalline silicon may be formed by crystallizing amorphous silicon. Examples of the crystallization method may include, but are not limited to, a rapid thermal annealing (RTA) method, a solid phase crystallization (SPC) method, an excimer laser annealing (ELA) method, a metal induced crystallization (MILC) method, and a sequential lateral solidification (SLS) method. When the semiconductor layer includes polycrystalline silicon, the first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b. The first doped region 126a, the second doped region 126b, the third doped region 146a, and the fourth doped region 146b may be regions of the first active material layer 126 and the second active material layer 146 which are doped with impurities.

In an embodiment, the first active material layer 126 and the second active material layer 146 may include an oxide semiconductor. The doped regions of the first active material layer 126 and the second active material layer 146 may be conducting regions, respectively. The oxide semiconductor may be an oxide semiconductor containing indium (In). In some embodiments, the oxide semiconductor may be, but is not limited to, indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO).

The first gate insulating layer 130 is disposed on the semiconductor layer and the buffer layer 115. The first gate insulating layer 130 may be disposed on the buffer layer 115 as well as the semiconductor layer. The first gate insulating layer 130 may function as a gate insulating film of each of the first and second transistors 120 and 140. The first gate insulating layer 130 may be formed of an inorganic material such as silicon oxide (SiOx) or silicon nitride (SiNx) or in a structure in which these materials are stacked.

The first gate conductive layer is disposed on the first gate insulating layer 130. The first gate conductive layer may include a first gate electrode 121 of the first transistor 120 and a second gate electrode 141 of the second transistor 140. The first gate electrode 121 overlaps at least a part of the first active material layer 126, and the second gate electrode 141 overlaps at least a part of the second active material layer 146 in a plan view. For example, the first gate electrode 121 may overlap the first channel region 126c of the first active material layer 126 in a thickness direction, and the second gate electrode 141 may overlap the second channel region 146c of the second active material layer 146 in the thickness direction.

The first gate conductive layer may be, but is not limited to, a single layer or a multilayer made of at least one of molybdenum (Mo), aluminum (Al), chromium (Cr), gold (Au), titanium (Ti), nickel (Ni), neodymium (Nd), copper (Cu), and alloys of the same.

The first passivation layer 150 is disposed on the first gate conductive layer. The first passivation layer 150 may cover the first gate conductive layer to protect it. The first passivation layer 150 may be formed of an inorganic material such as silicon oxide (SiOx) or silicon nitride (SiNx) or in a structure in which these materials are stacked.

The second gate conductive layer is disposed on the first passivation layer 150. The second gate conductive layer may include a first capacitor electrode 160 of a storage capacitor disposed such that at least a part overlaps the first gate electrode 121 in the thickness direction. The first capacitor electrode 160 may overlap the first gate electrode 121 in the thickness direction with the first passivation layer 150 interposed between them, and the storage capacitor may be formed between them. The second gate conductive layer may be, but is not limited to, a single layer or a multilayer made of at least one of molybdenum (Mo), aluminum (Al), chromium (Cr), gold (Au), titanium (Ti), nickel (Ni), neodymium (Nd), copper (Cu), and alloys of the same.

The first interlayer insulating layer 170 is disposed on the second gate conductive layer. The first interlayer insulating layer 170 may function as an insulating film between the second gate conductive layer and other layers disposed on the second gate conductive layer. The first interlayer insulating layer 170 may be formed of an inorganic material such as silicon oxide (SiOx) or silicon nitride (SiNx) or in a structure in which these materials are stacked.

The first data conductive layer is disposed on the first interlayer insulating layer 170. The first gate conductive layer may include the first source/drain electrode 123 and a second source/drain electrode 124 of the first transistor 120 and the first source/drain electrode 143 and a second source/drain electrode 144 of the second transistor 140.

The first source/drain electrode 123 and the second source/drain electrode 124 of the first transistor 120 may respectively contact the first doped region 126*a* and the second doped region 126*b* of the first active material layer 126 through contact holes penetrating the first interlayer insulating layer 170 and the first gate insulating layer 130. The first source/drain electrode 143 and the second source/drain electrode 144 of the second transistor 140 may respectively contact the third doped region 146*a* and the fourth doped region 146*b* of the second active material layer 146 through contact holes penetrating the first interlayer insulating layer 170 and the first gate insulating layer 130. The first source/drain electrode 123 of the first transistor 120 and the first source/drain electrode 143 of the second transistor 140 may be electrically connected to the first light blocking layer BML1 and the second light blocking layer BML2 through other contact holes, respectively. When one of the first source/drain electrodes 123 or 143 and the second source/drain electrodes 124 or 144 of each of the first transistor 120 and the second transistor 140 is a source electrode, the other electrode may be a drain electrode. However, the disclosure is not limited thereto. When one of the first source/drain electrode 123 or 143 and the second source/drain electrode 124 or 144 is a drain electrode, the other electrode may be a source electrode.

The first data conductive layer may be, but is not limited to, a single layer or a multilayer made of at least one of molybdenum (Mo), aluminum (Al), chromium (Cr), gold (Au), titanium (Ti), nickel (Ni), neodymium (Nd), copper (Cu), and alloys of the same.

The second interlayer insulating layer 180 may be disposed on the first data conductive layer. The second interlayer insulating layer 180 may be entirely disposed on the first interlayer insulating layer 170 to cover the first data conductive layer and may protect the first data conductive layer. The second interlayer insulating layer 180 may be formed of an inorganic material such as silicon oxide (SiOx) or silicon nitride (SiNx) or in a structure in which these materials are stacked.

The second data conductive layer is disposed on the second interlayer insulating layer 180. The second data conductive layer may include a first voltage wiring 191, a second voltage wiring 193, and a first conductive pattern 196. A low potential voltage (the first power supply voltage VSS) supplied to the second electrode 220 may be applied to the first voltage wiring 191, and a high potential voltage (the second power supply voltage VDD) supplied to the first transistor 120 may be applied to the second voltage wiring 193. During the manufacturing process of the display device 10, an alignment signal needed to align the light-emitting elements 300 may be transmitted to the first voltage wiring 191 as will be described below.

The first conductive pattern 196 may be electrically connected to the first source/drain electrode 123 of the first transistor 120 through a contact hole formed in the second interlayer insulating layer 180. The first conductive pattern 196 may also contact the first electrode 210 to be described below, and the first transistor 120 may transmit the second power supply voltage VDD received from the second voltage wiring 193 to the first electrode 210 through the first conductive pattern 196. Although the second data conductive layer includes one first voltage wiring 191 and one second voltage wiring 193 in the drawings, the disclosure is not limited thereto. The second data conductive layer may include a larger number of the first voltage wirings 191 and the second voltage wirings 193.

The second data conductive layer may be, but is not limited to, a single layer or a multilayer made of at least one of molybdenum (Mo), aluminum (Al), chromium (Cr), gold (Au), titanium (Ti), nickel (Ni), neodymium (Nd), copper (Cu), and alloys of the same.

The first planarization layer 200 is disposed on the second data conductive layer. The first planarization layer 200 may include an organic insulating material and perform a surface planarization function.

Inner banks 410 and 420, the electrodes 210 and 220, an outer bank 450, the contact electrodes 261 and 262, and the light-emitting elements 300 are disposed on the first planarization layer 200. The insulating layers 510, 520 and 550 may be further disposed on the first planarization layer 200.

The inner banks 410 and 420 are directly disposed on the first planarization layer 200. The inner banks 410 and 420 may include a first inner bank 410 and a second inner bank 420 disposed adjacent to the center of each pixel PX or subpixel PXn.

The first inner bank 410 and the second inner bank 420 may be spaced apart to face each other in the first direction DR1. The first inner bank 410 and the second inner bank 420 may extend in the second direction DR2 but may end at a distance from a boundary between subpixels PXn so that they do not extend to other subpixels PXn neighboring in the second direction DR2. Accordingly, the first inner bank 410 and the second inner bank 420 may be disposed in each subpixel PXn to form a pattern on the entire display device 10. Since the inner banks 410 and 420 are spaced apart to face each other, an area in which the light-emitting elements 300 are disposed may be formed between them. Although one first inner bank 410 and one second inner bank 420 are disposed in the drawings, the disclosure is not limited thereto. The inner banks 410 and 420 may each be disposed in plural numbers according to the number of the electrodes 210 and 220 to be described below, or a larger number of other inner banks 410 and 420 may be further disposed.

At least a part of each of the first inner bank 410 and the second inner bank 420 may protrude from an upper surface of the second interlayer insulating layer 180. The protruding part of each of the first inner bank 410 and the second inner bank 420 may have inclined side surfaces, and light emitted from the light-emitting elements 300 disposed between them may travel toward the inclined side surfaces of the inner banks 410 and 420. As will be described below, when the electrodes 210 and 220 disposed on the inner banks 410 and 420 include a material having high reflectivity, light emitted from the light-emitting elements 300 may be reflected by the side surfaces of the inner banks 410 and 420 to travel upward above the substrate 110. For example, the inner banks 410 and 420 may provide an area in which the light-emitting elements 300 are disposed and may function as reflective barriers that reflect light emitted from the light-emitting elements 300 in an upward direction. In an embodiment, the inner banks 410 and 420 may include, but are not limited to, an organic insulating material such as polyimide (PI).

The electrodes 210 and 220 are disposed on the inner banks 410 and 420 and the first planarization layer 200. The electrodes 210 and 220 may include the first electrode 210 disposed on the first inner bank 410 and the second electrode 220 disposed on the second inner bank 420.

Each of the first electrode 210 and the second electrode 220 may include an electrode stem part 210S or 220S extending in the first direction DR1 and at least one electrode branch part 210B or 220B extending and branching from the electrode stem part 210S or 220S in the second direction DR2.

The first electrode 210 may include a first electrode stem part 210S extending in the first direction DR1 and at least one first electrode branch part 210B branching from the first electrode stem part 210S and extending in the second direction DR2.

The first electrode stem part 210S of a pixel may have both ends ending between subpixels PXn but may lie on substantially the same straight line as the first electrode stem parts 210S of neighboring subpixels (e.g., adjacent in the first direction DR1) in the same row. Since both ends of the first electrode stem parts 210S respectively disposed in the subpixels PXn are spaced apart from each other, an electrical signal may be independently transmitted to each first electrode branch part 210B.

The first electrode branch part 210B branches from at least a part of the first electrode stem part 210S and extends in the second direction DR2. However, the first electrode branch part 210B may end at a position spaced apart from a second electrode stem part 220S facing the first electrode stem part 210S.

The second electrode 220 may include the second electrode stem part 220S extending in the first direction DR1 and at least one second electrode branch part 220B branching from the second electrode stem part 220S and extending in the second direction DR2. The second electrode stem part 220S may be spaced apart from the first electrode stem part 210S to face the first electrode stem part 210S, and the second electrode branch part 220B may be spaced apart from at least one first electrode branch part 210B to face the first electrode branch part 210B.

Unlike the first electrode stem part 210S, the second electrode stem part 220S may extend in the first direction DR1 to cross the subpixels PXn. The second electrode stem part 220S crossing the subpixels PXn may be connected to a peripheral part of the display area DPA in which each pixel PX or subpixel PXn is disposed or a part extending in a direction in the non-display area NDA.

The second electrode branch part 220B may branch from the second electrode stem part 220S in the second direction DR2 but may end at a position spaced apart from the first electrode stem part 210S. Since the second electrode branch part 220B is spaced apart from the first electrode branch part 210B to face the first electrode branch part 210B, an area in which the light-emitting elements 300 are disposed may be formed between them.

The first electrode 210 and the second electrode 220 may be electrically connected to the first transistor TR1 and the first voltage wiring 191 (or VSSL of FIG. 2), respectively. For example, the first electrode stem part 210S of the first electrode 210 may contact the conductive pattern 196 through a first electrode contact hole CNTD penetrating the first planarization layer 200 and thus may be electrically connected to the first source/drain electrode 123 of the first transistor TR1. Accordingly, the first electrodes 210 respectively disposed in the subpixels PXn may independently receive electrical signals from different first transistors TR1. The second electrode stem part 220S of the second electrode 220 may be electrically connected to those of other second electrodes 220, and a part extending in one direction in an area other than the display area DPA may contact the first voltage wiring 191 through a second electrode contact hole CNTD penetrating the first planarization layer 200. In the drawings, the first electrode contact hole CNTD is formed in the first electrode stem part 210S of each subpixel PXn, and only one second electrode contact hole CNTS is formed in one second electrode stem part 220 crossing the subpixels PXn. However, the disclosure is not limited thereto. The second electrode contact hole CNTS may also be formed in each subpixel PXn, and the second electrode 220 of each subpixel PXn may be electrically connected to the first voltage wiring 191.

Although two first electrode branch parts 210B and one second electrode branch part 220B are disposed in each subpixel PXn in the drawings, the disclosure is not limited thereto. In some embodiments, a greater or smaller number of the first electrode branch parts 210B and the second electrode branch parts 220B may be disposed. The first electrode 210 and the second electrode 220 disposed in each subpixel PXn may not necessarily extend in one direction and may also be disposed in various structures. For example, the first electrode 210 and the second electrode 220 may be partially curved or bent, or the first electrode 210 or the second electrode 220 may surround the other electrode. The structure or shape in which the first electrode 210 and the second electrode 220 are disposed is not particularly limited as long as the first electrode 210 and the second electrode 220 are at least partially spaced apart to face each other so that an area in which the light-emitting elements 300 are to be disposed can be formed between the first electrode 210 and the second electrode 220.

The first electrode 210 and the second electrode 220 may be disposed on the first inner bank 410 and the second inner bank 420, respectively, and may be spaced apart to face each other in the first direction DR1. The light-emitting elements 300 may be disposed between the first inner bank 410 and the second inner bank 420. The light-emitting elements 300 may be disposed between the first electrode 210 and the second electrode 220, and at least one end of each of the light-emitting elements 300 may be electrically connected to the first electrode 210 and the second electrode 220.

In some embodiments, the first electrode 210 and the second electrode 220 may be formed to have greater widths than the first inner bank 410 and the second inner bank 420, respectively. For example, the first electrode 210 and the second electrode 220 may be disposed to cover outer surfaces of the first inner bank 410 and the second inner bank 420, respectively. The first electrode 210 and the second electrode 220 may be disposed on the side surfaces of the first inner bank 410 and the second inner bank 420, respectively. As will be described below, the first electrode 210 and the second electrode 220 may include a material having high reflectivity to reflect light travelling toward the side surfaces of the first inner bank 410 and the second inner bank 420 after being emitted from the light-emitting elements 300. Accordingly, a distance between the first electrode 210 and the second electrode 220 may be smaller than a distance between the first inner bank 410 and the second inner bank 420. At least a part of each of the first electrode 210 and the second electrode 220 may be directly disposed on the first planarization layer 200.

The electrodes 210 and 220 may be electrically connected to the light-emitting elements 300 and may receive a selected voltage so that the light-emitting elements 300 can emit light. For example, the electrodes 210 and 220 may be electrically connected to the light-emitting elements 300 through the contact electrodes 261 and 262 to be described below and may transmit electrical signals, which are transmitted to the electrodes 210 and 220, to the light-emitting elements 300 through the contact electrodes 261 and 262.

In an embodiment, the first electrode 210 may be a pixel electrode separate for each subpixel PXn, and the second electrode 220 may be a common electrode commonly connected along each subpixel PXn. One of the first electrode 210 and the second electrode 220 may be anodes of the light-emitting elements 300, and the other may be cathodes of the light-emitting elements 300. However, the disclosure is not limited thereto, and the opposite may also be used.

Each of the electrodes 210 and 220 may form an electric field in a subpixel PXn to align the light-emitting elements 300. The light-emitting elements 300 may be placed between the first electrode 210 and the second electrode 220 through a process of forming an electric field between the first electrode 210 and the second electrode 220 by transmitting an alignment signal to the first electrode 210 and the second electrode 220. As will be described below, the light-emitting elements 300 may be sprayed onto the first electrode 210 and the second electrode 220 in a state where they are dispersed in a selected ink through an inkjet process and may be aligned between them by applying a dielectrophoretic force to the light-emitting elements 300 by transmitting an alignment signal between the first electrode 210 and the second electrode 220.

Each of the electrodes 210 and 220 may include a transparent conductive material. For example, each of the electrodes 210 and 220 may include a material such as indium tin oxide (ITO), indium zinc oxide (IZO), or indium tin zinc oxide (ITZO). However, the disclosure is not limited thereto. In some embodiments, each of the electrodes 210 and 220 may include a conductive material having high reflectivity. For example, each of the electrodes 210 and 220 may include a metal such as silver (Ag), copper (Cu) or aluminum (Al) as a material having high reflectivity. Each of the electrodes 210 and 220 may reflect incident light in the upward direction of each subpixel PXn.

However, the disclosure is not limited thereto, and each of the electrodes 210 and 220 may also have a structure in which a transparent conductive material and a metal layer having high reflectivity are each stacked in one or more layers or may be formed as a single layer including them. In an embodiment, each of the electrodes 210 and 220 may have a stacked structure of ITO/Ag/ITO/IZO or may be an alloy containing aluminum (Al), nickel (Ni), lanthanum (La), etc. However, the disclosure is not limited thereto.

The first insulating layer 510 is disposed on the first planarization layer 200, the first electrode 210, and the second electrode 220. The first insulating layer 510 may be disposed not only in an area between the electrodes 210 and 220 or the inner banks 410 and 420 but also on opposite sides of the inner banks 410 and 420 from the area between the inner banks 410 and 420. The first insulating layer 510 may partially cover the first electrode 210 and the second electrode 220. For example, the first insulating layer 510 may be entirely disposed on the first planarization layer 200 as well as the first electrode 210 and the second electrode 220 but may partially expose upper surfaces of the first electrode 210 and the second electrode 220. The first insulating layer 510 may include openings (not illustrated) formed to partially expose the first electrode 210 and the second electrode 220 and may cover only one side and the other side of each of the first electrode 210 and the second electrode 220. Parts of the first electrode 210 and the second electrode 220 which are disposed on the inner banks 410 and 420 may be partially exposed by the openings.

The first insulating layer 510 may protect the first electrode 210 and the second electrode 220 while insulating them from each other. The first insulating layer 510 may prevent the light-emitting elements 300 disposed on the first insulating layer 510 from directly contacting other members and thus being damaged. However, the shape and structure of the first insulating layer 510 are not limited thereto.

In an embodiment, a part of an upper surface of the first insulating layer 510 may be stepped between the first electrode 210 and the second electrode 220. In some embodiments, the first insulating layer 510 may include an inorganic insulating material, and a part of the upper surface of the first insulating layer 510 disposed to partially cover the first electrode 210 and the second electrode 220 may be stepped due to a step formed by the electrodes 210 and 220 disposed under the first insulating layer 510. Accordingly, the light-emitting elements 300 disposed on the first insulating layer 510 between the first electrode 210 and the second electrode 220 may form an empty space with the upper surface of the first insulating layer 510. The empty space may be filled with a material that forms the second insulating layer 520 to be described below.

Although not illustrated in the drawings, the outer bank 450 may be disposed on the first insulating layer 510. As illustrated in FIGS. 4 and 5, the outer bank 450 may be disposed at the boundary between the subpixels PXn. The outer bank 450 may extend at least in the second direction DR2 and may partially surround the inner banks 410 and 420 and the electrodes 210 and 220 as well as the area in which the light-emitting elements 300 are disposed between the inner banks 410 and 420 and between the electrodes 210 and 220. The outer bank 450 may further include parts extending in the first direction DR1, thereby forming a grid pattern in the entire display area DPA.

According to an embodiment, a height of the outer bank 450 may be greater than a height of each of the inner banks 410 and 420. Unlike the inner banks 410 and 420, the outer bank 450 may separate neighboring subpixels PXn while preventing ink from overflowing to adjacent subpixels PXn in an inkjet process for placing the light-emitting elements 300 during the manufacturing process of the display device 10. For example, the outer bank 450 may separate inks in which different light-emitting elements 300 are dispersed for different subpixels PXn so as to prevent the inks from being mixed with each other. Like the inner banks 410 and 420, the outer bank 450 may include, but is not limited to, polyimide (PI).

The light-emitting elements 300 may be disposed between the first electrode 210 and the second electrode 220 or between the first inner bank 410 and the second inner bank 420. Each of the light-emitting elements 300 may have an end electrically connected to the first electrode 210 and the other end electrically connected to the second electrode 220. Each of the light-emitting elements 300 may be electrically connected to the first electrode 210 and the second electrode 220 through the contact electrodes 261 and 262 to be described below, respectively.

The light-emitting elements 300 may be spaced apart from each other and aligned substantially parallel to each other. A gap between the light-emitting elements 300 is not particularly limited. Light-emitting elements 300 may be disposed adjacent to each other to form a group, and other light-emitting elements 300 may form a group at a certain distance from the above group, or the light-emitting elements 300 may be oriented and aligned in a direction with non-uniform density. In an embodiment, the light-emitting elements 300 may extend in a direction, and the direction in which each of the electrodes 210 and 220 extends and the direction in which the light-emitting elements 300 extend may be substantially perpendicular to each other. However, the disclosure is not limited thereto, and the light-emitting elements 300 may also extend in a direction not perpendicular but oblique to the direction in which each of the electrodes 210 and 220 extends.

The light-emitting elements 300 according to an embodiment may include active layers 330 including different materials to emit light of different wavelength bands. The display device 10 according to the embodiment may include the light-emitting elements 300 which emit light of different wavelength bands. Each light-emitting element 300 of the first subpixel PX1 may include an active layer 330 that emits light of the first color whose central wavelength band is a first wavelength, each light-emitting element 300 of the second subpixel PX2 may include an active layer 330 that emits light of the second color whose central wavelength band is a second wavelength, and each light-emitting element 300 of the third subpixel PX3 may include an active layer 330 that emits light of the third color whose central wavelength band is a third wavelength.

Accordingly, the light of the first color may be output from the first subpixel PX1, the light of the second color may be output from the second subpixel PX2, and the light of the third color may be output from the third subpixel PX3. In some embodiments, the light of the first color may be blue light whose central wavelength band is in the range of about 450 nm to about 495 nm, the light of the second color may be green light whose central wavelength band is in the range of about 495 nm to about 570 nm, and the light of the third color may be red light whose central wavelength band is in the range of about 620 nm to about 752 nm. However, the disclosure is not limited thereto. The first subpixel PX1, the second subpixel PX2, and the third subpixel PX3 may include the light-emitting elements 300 of the same type to emit light of substantially the same color.

The light-emitting elements 300 may be disposed on the first insulating layer 510 between the electrodes 210 and 220. For example, the light-emitting elements 300 may be disposed on the first insulating layer 510 between the inner banks 410 and 420. Parts of each light-emitting element 300 may overlap the electrodes 210 and 220 in the thickness direction. An end of each of the light-emitting elements 300 may overlap the first electrode 210 in the thickness direction to lie on the first electrode 210, and the other end of each of the light-emitting elements 300 may overlap the second electrode 220 to lie on the second electrode 220. However, the disclosure is not limited thereto. Although not illustrated in the drawings, at least some of the light-emitting elements 300 disposed in each subpixel PXn may be disposed in an area other than the area between the inner banks 410 and 420, for example, may be disposed between each of the inner banks 410 and 420 and the outer bank 450.

In each of the light-emitting elements 300, layers may be disposed in a direction parallel to an upper surface of the substrate 110 or the first planarization layer 200. Each of the light-emitting elements 300 of the display device 10 according to the embodiment may extend in a direction and have a structure in which semiconductor layers are sequentially disposed along the direction. The direction in which the light-emitting elements 300 extend may be parallel to the first planarization layer 200, and the semiconductor layers included in each of the light-emitting elements 300 may be sequentially disposed along the direction parallel to the upper surface of the first planarization layer 200. However, the disclosure is not limited thereto. In case that the light-emitting elements 300 have a different structure, the layers may be disposed in a direction perpendicular to the first planarization layer 200. The structure of each of the light-emitting elements 300 will be described in more detail below with reference to FIG. 7.

The second insulating layer 520 may be disposed on a part of each light-emitting element 300 disposed between the first electrode 210 and the second electrode 220. For example, the second insulating layer 520 may partially cover outer surfaces of the light-emitting elements 300 to protect the light-emitting elements 300 while fixing the light-emitting elements 300 during the manufacturing process of the display device 10. A part of the second insulating layer 520 which is disposed on the light-emitting elements 300 may extend in the second direction DR2 between the first electrode 210 and the second electrode 220 in a plan view. For example, the second insulating layer 520 may form a stripe or island-shaped pattern in each subpixel PXn.

The second insulating layer 520 may be disposed on the light-emitting elements 300 but may expose an end and the other end of each of the light-emitting elements 300. The exposed ends of each of the light-emitting elements 300 may contact the contact electrodes 261 and 262 to be described below. This shape of the second insulating layer 520 may be formed by performing a patterning process on a material that forms the second insulating layer 520 using a mask process. A mask used to form the second insulating layer 520 may have a width smaller than a length of each light-emitting element 300, and the material that forms the second insulating layer 520 may be patterned to expose both ends of each of the light-emitting elements 300. However, the disclosure is not limited thereto.

In an embodiment, a part of the material of the second insulating layer 520 may be disposed between lower surfaces of the light-emitting elements 300 and the first insulating layer 510. The second insulating layer 520 may be formed to fill the space between the first insulating layer 510 and each light-emitting element 300 formed during the manufacturing process of the display device 10. Accordingly, the second insulating layer 520 may be formed to cover the outer surfaces of the light-emitting elements 300. However, the disclosure is not limited thereto.

The contact electrodes 261 and 262 may be disposed on the second insulating layer 520.

As illustrated in FIG. 4, the contact electrodes 261 and 262 may extend in a direction. The contact electrodes 261 and 262 may contact the light-emitting elements 300 and the electrodes 210 and 220, and the light-emitting elements 300 may receive electrical signals from the first electrode 210 and the second electrode 220 through the contact electrodes 261 and 262.

The contact electrodes 261 and 262 may include the first contact electrode 261 and the second contact electrode 262. The first contact electrode 261 and the second contact electrode 262 may be disposed on parts of the first electrode 210 and the second electrode 220, respectively. The first contact electrode 261 may be disposed on the first electrode 210, the second contact electrode 262 may be disposed on the second electrode 220, and the first contact electrode 261 and the second contact electrode 262 may extend in the second direction DR2. The first contact electrode 261 and the second contact electrode 262 disposed on the second insulating layer 520 may be spaced apart to face each other in the first direction DR1 and may form a stripe pattern in the emission area EMA of each subpixel PXn.

In some embodiments, widths of the first contact electrode 261 and the second contact electrode 262 measured in a direction may be greater than the widths of the first electrode 210 and the second electrode 220 or the second electrode branch part 220B measured in the direction, respectively. The first contact electrode 261 and the second contact electrode 262 may respectively contact an end and the other end of each light-emitting element 300 and cover both side surfaces of the first electrode 210 and the second electrode 220. As described above, the upper surfaces of the first electrode 210 and the second electrode 220 may be partially exposed, and the first contact electrode 261 and the second contact electrode 262 may contact the exposed upper surfaces of the first electrode 210 and the second electrode 220. For example, the first contact electrode 261 may contact a part of the first electrode 210 which is located on the first inner bank 410, and the second contact electrode 262 may contact a part of the second electrode 220 which is located on the second inner bank 420. However, the disclosure is not limited thereto. The first contact electrode 261 and the second contact electrode 262 may have smaller widths than the first electrode 210 and the second electrode 220 to cover only the exposed parts of the upper surfaces of the first electrode 210 and the second electrode 220.

As illustrated in FIG. 6, the first contact electrode 261 and the second contact electrode 262 may be disposed on the first electrode 210 and the second electrode 220, respectively, and at least a part thereof may also be disposed on the first insulating layer 510 and the light-emitting elements 300.

Semiconductor layers may be exposed at both end surfaces of each light-emitting element 300 in the direction in which each light-emitting element 300 extends, and the first contact electrode 261 and the second contact electrode 262 may contact each light-emitting element 300 at the end surfaces where the semiconductor layers are exposed. However, the disclosure is not limited thereto. Side surfaces of both of the ends of each light-emitting element 300 may be partially exposed. During the manufacturing process of the display device 10, an insulating film 380 (refer to FIG. 7) surrounding outer surfaces of the semiconductor layers of each light-emitting element 300 may be partially removed in the process of forming the second insulating layer 520 that covers the outer surface of each light-emitting element 300, and the exposed side surfaces of each light-emitting element 300 may contact the first contact electrode 261 and the second contact electrode 262. An end of each of the light-emitting elements 300 may be electrically connected to the first electrode 210 through the first contact electrode 261, and the other end of each of the light-emitting elements 261 may be electrically connected to the second electrode 220 through the second contact electrode 262.

Although two first contact electrodes 261 and one second contact electrode 262 are disposed in one subpixel PXn in the drawings, the disclosure is not limited thereto. The number of the first contact electrodes 261 and the second contact electrodes 262 may vary according to the number of the first electrodes 210 and the second electrodes 220 disposed in each subpixel PXn.

Respective ends of the first contact electrode 261 and the second contact electrode 262 which face each other may be disposed on the second insulating layer 520 and may be spaced apart from each other on the second insulating layer 520. However, the disclosure is not limited thereto. Although not illustrated in the drawings, another insulating layer may be further disposed between the first contact electrode 261 and the second contact electrode 262. The insulating layer may cover the first contact electrode 261 to insulate the first contact electrode 261 and the second contact electrode 262 from each other.

The contact electrodes 261 and 262 may include a conductive material such as ITO, IZO, ITZO, or aluminum (Al). However, the disclosure is not limited thereto.

The third insulating layer 550 may be entirely disposed on the substrate 110. The third insulating layer 550 may function to protect members disposed on the substrate 110 from the external environment.

Each of the first insulating layer 510, the second insulating layer 520, and the third insulating layer 550 described above may include an inorganic insulating material or an organic insulating material. In an embodiment, each of the first insulating layer 510, the second insulating layer 520, and the third insulating layer 550 may include an inorganic insulating material such as silicon oxide (SiOx), silicon nitride (SiNx), silicon oxynitride (SiOxNy), aluminum oxide (Al2O3), or aluminum nitride (AlN). In other examples, each of the first insulating layer 510, the second insulating layer 520, and the third insulating layer 550 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the disclosure is not limited thereto.

The light-emitting elements 300 may be light emitting didoes. Specifically, each of the light-emitting elements 300 may be an inorganic light emitting diode having a size in a range of micrometers or nanometers and made of an inorganic material. When an electric field is formed between two electrodes facing each other, the inorganic light emitting diode may be aligned between the two electrodes in the direction of the polarity of the field. The light-emitting elements 300 may be aligned between the two electrodes by the electric field formed on the electrodes.

The light-emitting elements 300 according to an embodiment may extend in one direction. Each of the light-emitting elements 300 may be shaped like a rod, a wire, a tube, or the like. In an embodiment, each of the light-emitting elements 300 may be shaped like a cylinder or a rod. However, the shape of the light-emitting elements 300 is not limited thereto, and each of the light-emitting elements 300 may have various shapes including polygonal prisms, such as a cube, a rectangular parallelepiped and a hexagonal prism, and a shape extending in a direction and having a partially inclined outer surface. Semiconductors included in each of the light-emitting elements 300 which will be described below may be sequentially disposed or stacked along the one direction.

Each of the light-emitting elements 300 may include a semiconductor layer doped with impurities of any conductivity type (e.g., a p-type or an n-type). The semiconductor layer may receive an electrical signal from an external power source and emit the electrical signal as light of a wavelength band.

Figure 7:
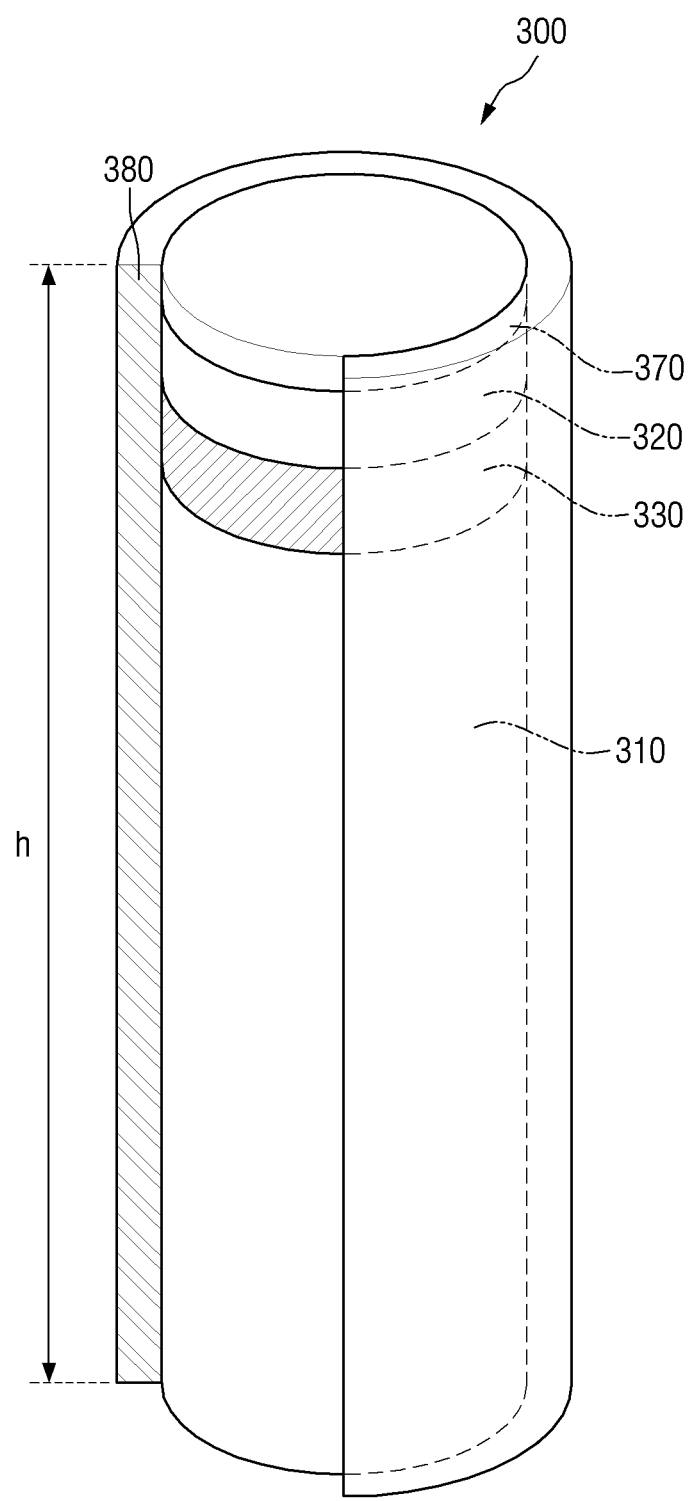
FIG. 7 is a schematic view of a light-emitting element according to an embodiment.

FIG. 7 is a schematic view of a light-emitting element according to an embodiment.

Referring to FIG. 7, the light-emitting element 300 may include a first semiconductor layer 310, a second semiconductor layer 320, an active layer 330, an electrode layer 370, and an insulating film 380.

The first semiconductor layer 310 may be an n-type semiconductor. In an example, when the light-emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$), for example, one or more of n-type doped materials AlGaInN, GaN, AlGaN, InGaN, AlN, and InN. The first semiconductor layer 310 may be doped with an n-type dopant, and the n-type dopant may be, for example, Si, Ge, or Sn. In an embodiment, the first semiconductor layer 310 may be n-GaN doped with n-type Si. A length of the first semiconductor layer 310 may be in the range of, but not limited to, about 1.5 to about 5 μm.

The second semiconductor layer 320 is disposed on the active layer 330 to be described below. The second semiconductor layer 320 may be a p-type semiconductor. In an example, when the light-emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$), for example, one or more of p-type doped AlGaInN, GaN, AlGaN, InGaN, AlN, and InN. The second semiconductor layer 320 may be doped with a p-type dopant, and the p-type dopant may be, for example, Mg, Zn, Ca, Se, or Ba. In an embodiment, the second semiconductor layer 320 may be p-GaN doped with p-type Mg. A length of the second semiconductor layer 320 may be in the range of, but not limited to, about 0.05 to about 0.10 μm.

Although each of the first semiconductor layer 310 and the second semiconductor layer 320 is composed of one layer in the drawing, the disclosure is not limited thereto. According to some embodiments, each of the first semiconductor layer 310 and the second semiconductor layer 320 may include more layers, for example, may further include a clad layer or a tensile strain barrier reducing (TSBR) layer depending on the material of the active layer 330. This will be described below with reference to other drawings.

The active layer 330 is disposed between the first semiconductor layer 310 and the second semiconductor layer 320. The active layer 330 may include a material having a single or multiple quantum well structure. When the active layer 330 includes a material having a multiple quantum well structure, it may have a structure in which quantum layers and well layers are alternately stacked. The active layer 330 may emit light through combination of electron-hole pairs according to an electrical signal received through the first semiconductor layer 310 and the second semiconductor layer 320. For example, when the active layer 330 emits light in the blue wavelength band, it may include a material such as AlGaN or AlGaInN. In particular, when the active layer 330 has a multiple quantum well structure, in which a quantum layer and a well layer are alternately stacked, the quantum layer may include a material such as AlGaN or AlGaInN, and the well layer may include a material such as GaN or AlInN. In an embodiment, the active layer 330 may include AlGaInN as a quantum layer and AlInN as a well layer to emit blue light whose central wavelength band is in the range of about 450 to about 495 nm as described above.

However, the disclosure is not limited thereto, and the active layer 330 may also have a structure in which a semiconductor material having a large band gap energy and a semiconductor material having a small band gap energy are alternately stacked or may include different group 3 to 5 semiconductor materials depending on the wavelength band of light that it emits. Light emitted from the active layer 330 is not limited to light in the blue wavelength band. The active layer 330 may emit light in a red or green wavelength band. A length of the active layer 330 may be in the range of, but not limited to, about 0.05 to about 0.10 μm.

Light emitted from the active layer 330 may be radiated not only to an outer surface of the light-emitting element 300 in a longitudinal direction, but also to both of the side surfaces. The direction of light emitted from the active layer 330 is not limited to a single direction.

The electrode layer 370 may be an ohmic contact electrode. However, the disclosure is not limited thereto, and the electrode layer 370 may also be a Schottky contact electrode. The light-emitting element 300 may include at least one electrode layer 370. Although the light-emitting element 300 includes one electrode layer 370 in FIG. 7, the disclosure is not limited thereto. The light-emitting element 300 may include more electrode layers 370, or the electrode layer 370 may be omitted. The following description of the light-emitting element 300 may apply regardless of the number of the electrode layers 370 or other structural changes.

When the light-emitting element 300 is electrically connected to the electrodes 210 and 220 or the contact electrodes 261 and 262, the electrode layer 370 may reduce the resistance between the light-emitting element 300 and the electrodes or the contact electrodes. The electrode layer 370 may include a conductive metal. For example, the electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may include an n-type or p-type doped semiconductor material. The electrode layer 370 may include the same material or different materials, but the disclosure is not limited thereto.

The insulating film 380 surrounds outer surfaces of the semiconductor layers and the electrode layers described above. In an embodiment, the insulating film 380 may surround an outer surface of at least the active layer 330 and extend in the direction of the light-emitting element 300. The insulating film 380 may protect the above members. For example, the insulating film 380 may surround side surfaces of the above members but may expose the ends of the light-emitting element 300 in the longitudinal direction.

In the drawing, the insulating film 380 extends in the longitudinal direction of the light-emitting element 300 to cover from side surfaces of the first semiconductor layer 310 to side surfaces of the electrode layer 370. However, the disclosure is not limited thereto, and the insulating film 380 may also cover outer surfaces of only some semiconductor layers as well as the active layer 330 or may cover only a part of the outer surface of each electrode layer 370 to partially expose the outer surface of the electrode layer 370. An upper surface of the insulating film 380 may be rounded in cross section in an area adjacent to at least one end of the light-emitting element 300.

A thickness of the insulating film 380 may be in the range of, but not limited to, about 10 nm to about 1.0 μm. The thickness of the insulating film 380 may be, for example, about 40 nm.

The insulating film 380 may include a material having insulating properties such as silicon oxide (SiOx), silicon nitride (SiNx), silicon oxynitride (SiOxNy), aluminum nitride (AlN), or aluminum oxide (Al2O3). Therefore, the insulating film 380 can prevent an electrical short circuit that may occur when the active layer 330 directly contacts an electrode through which an electrical signal is transmitted to the light-emitting element 300. The insulating film 380 can prevent a reduction in luminous efficiency by protecting the outer surface of the light-emitting element 300 including the active layer 330.

In other embodiments, the outer surface of the insulating film 380 may be treated. When the display device 10 is manufactured, the light-emitting element 300 may be dispersed in a selected ink that is sprayed on the electrodes, and then the light-emitting elements 300 may be aligned. The surface of the insulating film 380 may be hydrophobic or hydrophilic-treated so that the light-emitting elements 300 remain separate from other adjacent light-emitting elements 300 in the ink without agglomerating together.

A length h of the light-emitting element 300 may be in the range of about 1 to about 10 μm or about 2 to about 6 μm and may, for example, be in the range of about 3 to about 5 μm. A diameter of the light-emitting element 300 may be in the range of about 300 to about 700 nm, and an aspect ratio of the light-emitting element 300 may be about 1.2 to about 100. However, the disclosure is not limited thereto, and light-emitting elements 300 included in the display device 10 may also have different diameters according to a difference in composition of the active layer 330. The diameter of the light-emitting element 300 may, for example, be about 500 nm.

As described above, when an alignment signal is transmitted to each of the electrodes 210 and 220 during the manufacturing process of the display device 10, an electric field is formed on the electrodes 210 and 220. The light-emitting elements 300 may be aligned between the electrodes 210 and 220 as their orientation directions and positions are changed by a dielectrophoretic force due to the electric field. The alignment signal transmitted to each of the electrodes 210 and 220 may be transmitted from external alignment pads in a pad area PDA located in the non-display area NDA. According to an embodiment, in the display device 10, a voltage wiring to which an alignment signal is transmitted, for example, the first voltage wiring VSSL may include multiple alignment wirings separated from each other. The display area DPA in which wirings electrically connected to each alignment wiring are disposed may receive alignment signals from different alignment pads. When the display device 10 includes a large display area DPA and a large number of pixels PX or subpixels PXn, the strength of an electric field for aligning the light-emitting elements 300 may decline in pixels located far from an alignment pad that transmits an alignment signal. According to an embodiment, an alignment signal transmitted to align the light-emitting elements 300 may be transmitted to different display areas DPA through different alignment wirings, and an electric field of uniform strength may be formed in the whole of each display area DPA. Accordingly, the light-emitting elements 300 can be uniformly aligned in each pixel PX or subpixel PXn, and the problem of heat generation of the electrodes 210 and 220 or wirings that may be caused by an alignment signal can be addressed.

Figure 8:
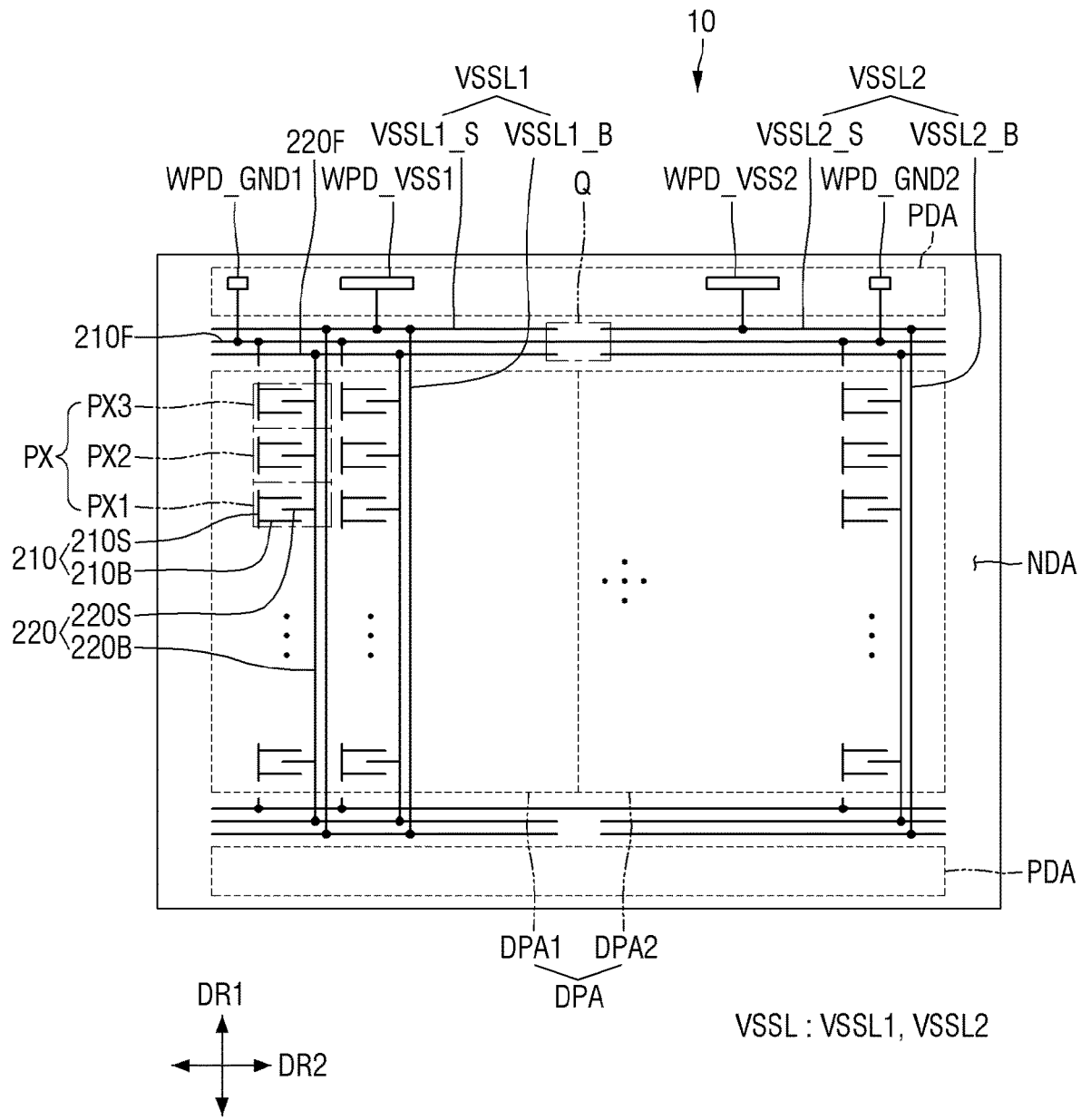
FIG. 8 is a schematic plan view illustrating the arrangement of electrodes and a first voltage wiring of the display device according to an embodiment.

FIG. 8 is a schematic plan view illustrating the arrangement of electrodes and the first voltage wiring of the display device according to the embodiment.

For ease of description, FIG. 8 illustrates only the first electrodes 210, the second electrodes 220 and the first voltage wiring VSSL disposed in the display area DPA and the non-display area NDA and pads WPD_VSS and WPD_GND disposed in the pad area PDA. Other components described above but not illustrated in the drawing may be disposed in the display area DPA, the non-display area NDA, and the pad area PDA.

Referring to FIG. 8, the display area DPA may be divided into different display areas DPA according to position. For example, the display area DPA may include a first display area DPA1 and a second display area DPA2 which may be located on one side and the other side of the center of the display area DPA, respectively. The first display area DPA1 and the second display area DPA2 may substantially constitute one display area DPA and may be defined as areas distinguished from each other according to the arrangement of the first voltage wiring VSSL to be described below.

Pixels PX and subpixels PXn are disposed in each of the first display area DPA1 and the second display area DPA2. Each of the subpixels PXn may include the first electrode 210 and the second electrode 220 as described above, and each of the first electrode 210 and the second electrode 220 may include the electrode stem part 210S or 220S and the electrode branch part 210B or 220B. The first electrode stem parts 210S may be spaced apart from each other at a boundary between neighboring subpixels PXn, but the second electrode stem part 220S may extend in the first direction DR1 to the non-display area NDA beyond the display area DPA. The first electrode branch part 210B, the second electrode branch part 220B, and other members are the same as described above.

According to an embodiment, the display device 10 may further include a first electrode wiring 210F and a second electrode wiring 220F disposed in the non-display area NDA. The first electrode wiring 210F and the second electrode wiring 220F may extend in a direction and may be disposed in the non-display area NDA located outside the display area DPA. For example, the first electrode wiring 210F and the second electrode wiring 220F may extend in the second direction DR2 and may be disposed on each of the sides of the display area DPA in the first direction DR1. The first electrode wiring 210F and the second electrode wiring 220F may extend in the second direction DR2 between the display area DPA and the pad area PDA. The electrode wirings 210F and 220F disposed on upper and lower sides of the display area DPA may have substantially the same structure. Among the first electrode wirings 210F and the second electrode wirings 220F, wirings disposed on the other side of the display area DPA in the first direction DR1 may be omitted. The electrode wirings 210F and 220F disposed on the upper side of the display area DPA (in the first direction DR1) will be described in detail below, and the electrode wirings 210F and 220F disposed on the lower side of the display area DPA which is the other side in the first direction DR1 will not be described.

Each of the first electrode wiring 210F and the second electrode wiring 220F may be a wiring to which an alignment signal is transmitted during the manufacturing process of the display device 10. During the manufacturing process of the display device 10, an alignment signal may be transmitted with the first electrode wiring 210F is electrically connected to the first electrodes 210, for example, the first electrode stem parts 210S and where the second electrode wiring 220F is electrically connected to the second electrode stem part 220S. The alignment signal may be transmitted to each of the electrodes 210 and 220 from each of the electrode wirings 210F and 220F to form an electric field on the electrodes 210 and 220.

The second electrode stem part 220S may extend in the first direction DR1 across subpixels PXn and may be electrically connected to the second electrode wiring 220F. The first electrode stem part 210S may be separated for each subpixel PXn after the light-emitting elements 300 are aligned during the manufacturing process of the display device 10. Accordingly, the first electrodes 210 may be separated from the first electrode wiring 210F, and the first electrode wiring 210F may be a floating line disposed in the non-display area NDA of the display device 10.

According to an embodiment, in the first electrode wiring 210F, one wiring may be disposed in the non-display area NDA between the display area DPA and the pad area PDA. In the second electrode wiring 220F, two or more wirings may be spaced apart from each other in the non-display area NDA between the display area DPA and the pad area PDA. For example, in the first electrode wiring 210F, one wiring may be disposed in the non-display area NDA and may extend from the first display area DPA1 to the second display area DPA2. In the second electrode wiring 220F, multiple wirings may be disposed in the non-display area NDA and may be disposed in areas corresponding to the first display area DPA1 and the second display area DPA2, respectively. The wirings of the second electrode wiring 220F may be spaced apart from each other in a part (a part Q of FIG. 8) where a boundary between the first display area DPA1 and the second display area DPA2 is located.

The first voltage wiring VSSL may be disposed in the display area DPA and the non-display area NDA. The first voltage wiring VSSL may include wiring stem parts VSSL1_S and VSSL2_S disposed in the non-display area NDA and extending in the second direction DR2 and wiring branch parts VSSL1_B and VSSL2_B branching from the wiring stem parts VSSL1_S and VSSL2_S in the first direction DR1 and disposed in the display area DPA. The first voltage wiring VSSL may be electrically connected to the second electrodes 220 in the wiring stem parts VSSL1_S and VSSL2_S disposed in the non-display area NDA and the wiring branch parts VSSL1_B and VSSL2_B disposed in the display area DPA. The first power supply voltage VSS may be applied to the first voltage wiring VSSL as described above, and an alignment signal may be transmitted during the manufacturing process of the display device 10.

Like the second electrode wiring 220F, the first voltage wiring VSSL may include multiple wirings, and the wirings may be separated from each other in the non-display area NDA. According to an embodiment, the first voltage wiring VSSL may include a first separation wiring VSSL1 and a second separation wiring VSSL2 separated from each other. The first separation wiring VSSL1 may be disposed in the first display area DPA1 and the non-display area NDA between the first display area DPA1 and the pad area PDA, and the second separation wiring VSSL2 may be disposed in the second display area DPA2 and the non-display area NDA between the second display area DPA2 and the pad area PDA.

The first separation wiring VSSL1 may include first wiring branch parts VSSL1_B disposed in the first display area DPA1 and a first wiring stem part VSSL1_S disposed between the first display area DPA1 and the pad area PDA and connected to the first wiring branch parts VSSL1_B. The second separation wiring VSSL2 may include second wiring branch parts VSSL2_B disposed in the second display area DPA2 and a second wiring stem part VSSL2_S disposed between the second display area DPA2 and the pad area PDA and connected to the second wiring branch parts VSSL2_B.

The first wiring stem part VSSL1_S and the second wiring stem part VSSL2_S may be disposed in the non-display area NDA located above or below the first display area DPA1 and the second display area DPA2, respectively. The first wiring stem part VSSL1_S and the second wiring stem part VSSL2_S may be spaced apart from each other in a part (the part Q of FIG. 8) of the non-display area NDA where the boundary between the first display area DPA1 and the second display area DPA2 is located. The first wiring stem part VSSL1_S and the second wiring stem part VSSL2_S are connected to different power pads, for example, a (1-1)th power pad WPD_VSS1 and a (1-2)th power pad WPD_VSS2, respectively. Accordingly, an electrical signal may be independently transmitted to each of the first separation wiring VSSL1 and the second separation wiring VSSL2.

As described above, the second electrodes 220 may be electrically connected to the first voltage wiring VSSL. Referring to FIG. 6, described above, the second electrode 220 may be electrically connected to the first voltage wiring 191 through the contact hole CNTS. However, since each of the second electrodes 220 and the first voltage wiring VSSL includes multiple wirings separated from each other, the wirings of the first display area DPA1 and the second display area DPA2 may be separated from each other. The second electrodes 220 disposed in the first display area DPA1 may be electrically connected only to the first separation wiring VSSL1 of the first voltage wiring VSSL, and the second electrodes 220 disposed in the second display area DPA2 may be electrically connected only to the second separation wiring VSSL2 of the first voltage wiring VSSL.

During the manufacturing process of the display device 10, an alignment signal may be transmitted to the first voltage wiring VSSL and then may be transmitted to the second electrodes 220 connected to the first voltage wiring VSSL. Since the first separation wiring VSSL1 and the second separation wiring VSSL2 of the first voltage wiring VSSL receive alignment signals from different first power pads WPD_VSS1 and WPD_VSS2, the alignment signals may be independently transmitted to the second electrodes 220 disposed in the first display area DPA1 and the second electrodes 220 disposed in the second display area DPA2.

The first electrode wiring 210F may be connected to ground power pads WPD_GND1 and WPD_GND2 disposed in the pad area PDA. Even if parts of the first electrode wiring 210F are connected to different pads, since the first electrode wiring 210F is disposed as a single wiring, it may have the same electric potential. During the manufacturing process of the display device 10, the same alignment signal may be transmitted to each of the first electrodes 210 disposed in the first display area DPA1 and the second display area DPA2.

Since the display device 10 according to the embodiment includes the first voltage wiring VSSL and the second electrode wiring 220F including wirings separated from each other in the non-display area NDA, an alignment signal may be independently transmitted in each of different display areas DPA during the manufacturing process. For example, an alignment signal may be transmitted to the second electrodes 220 through the first separation wiring VSSL1 in the first display area DPA1, and an alignment signal may be transmitted to the second electrodes 220 through the second separation wiring VSSL2 in the second display area DPA2. Even if the display device 10 includes a large number of pixels PX or subpixels PXn, it is possible to transmit an alignment signal only to a certain display area DPA using a power pad. Thus, it is possible to maintain an electric field of uniform strength in each of the display areas DPA. This will be described in detail below.

If the separation wirings VSSL1 and VSSL2 of the first voltage wiring VSSL are not electrically connected while the display device 10 is being driven, there may be a difference in electric potential of the first power supply voltage VSS applied to each display area DPA. The first power supply voltage VSS applied to the first display area DPA1 through the first separation wiring VSSL1 may be different from the first power supply voltage VSS applied to the second display area DPA2 through the second separation wiring VSSL2. The intensity of light or image quality displayed in each display area DPA may be different.

The display device 10 according to the embodiment may include a first switching transistor ST1 disposed in the non-display area NDA and having source/drain electrodes connected to the first separation wiring VSSL1 and the second separation wiring VSSL2. The first switching transistor ST1 is kept turned off during the manufacturing process of the display device 10 and is kept turned on during driving of the display device 10. When the first switching transistor ST1 between the first separation wiring VSSL1 and the second separation wiring VSSL2 is turned on, the first power supply voltage VSS having a uniform electric potential may be applied to the first display area DPA1 and the second display area DPA2 while the display device 10 is being driven.

Figure 9:
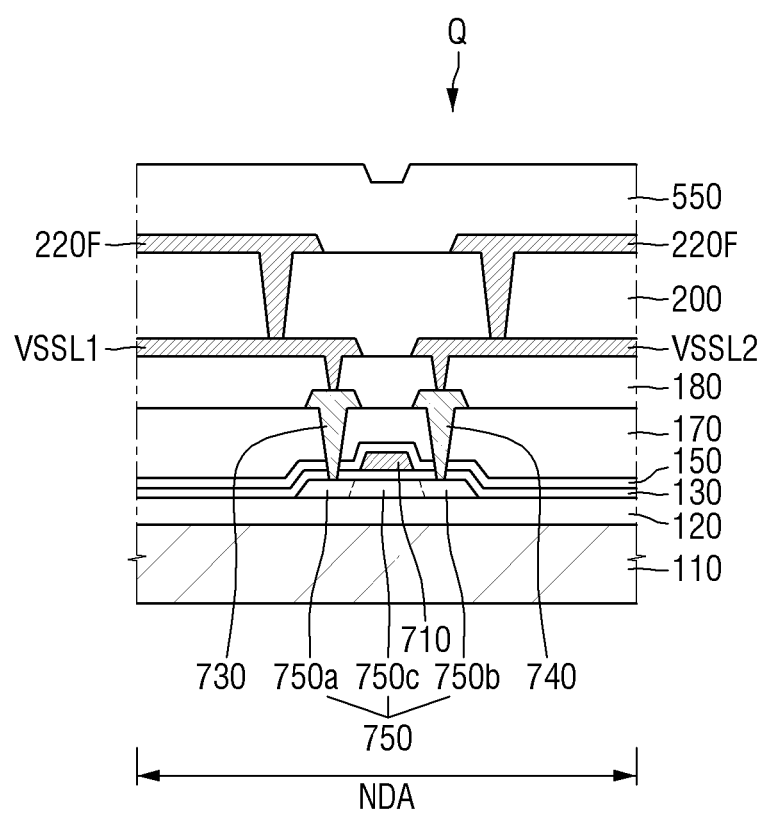
FIG. 9 is a schematic cross-sectional view of a part Q of FIG. 8.
Figure 10:
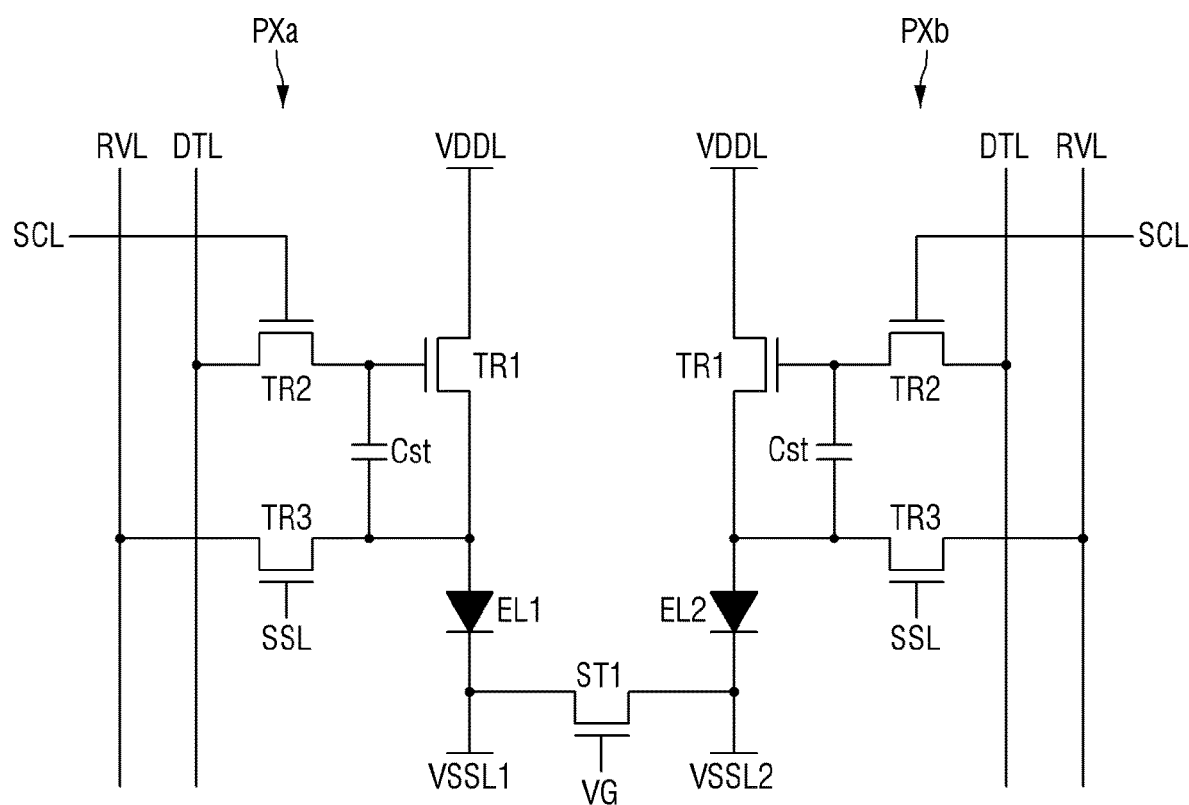
FIG. 10 is a schematic diagram of an equivalent circuit of subpixels of the display device according to an embodiment.

FIG. 9 is a schematic cross-sectional view of the part Q of FIG. 8. FIG. 10 is a schematic diagram of an equivalent circuit of some subpixels of the display device according to the embodiment.

Referring to FIG. 9, the display device 10 according to the embodiment may include the first switching transistor ST1 disposed in the non-display area NDA and having the source/drain electrodes connected to the first voltage wiring VSSL. The first switching transistor ST1 may have substantially the same structure as the second transistor TR2. For example, the first switching transistor ST1 includes a third active material layer 750, a third gate electrode 710, a first source/drain electrode 730, and a second source/drain electrode 740. The first switching transistor ST1 has the same structure as that described above through the second transistor TR2 except that it is disposed in the non-display area NDA.

Although not illustrated in the drawing, the third gate electrode 710 of the first switching transistor ST1 may receive turn-on and turn-off signals from a gate voltage line VG connected to the scan driver SDR. The first switching transistor ST1 may receive a turn-on signal from the gate voltage line VG during driving of the display device 10 and may receive a turn-off signal during a manufacturing process.

In the first switching transistor ST1, the first source/drain electrode 730 may be electrically connected to the first separation wiring VSSL1, for example, the first wiring stem part VSSL1_S of the first voltage wiring VSSL, and the second source/drain electrode 740 may be electrically connected to the second separation wiring VSSL2, for example, the second wiring stem part VSSL2_S of the first voltage wiring VSSL. Each of the first separation wiring VSSL1 and the second separation wiring VSSL2 may be electrically connected to the second electrode wiring 220F in the non-display area NDA.

According to an embodiment, the first switching transistor ST1 may be turned off during the manufacturing process of the display device 10. When an alignment signal is transmitted only to the first separation wiring VSSL1, it does not flow through the turned-off first switching transistor ST1. Accordingly, the alignment signal is not transmitted to the second separation wiring VSSL2 and is not transmitted to the second electrode wiring 220F connected to the second separation wiring VSSL2. Likewise, when an alignment signal is transmitted only to the second separation wiring VSSL2, it does not flow through the turned-off first switching transistor ST1 and is not transmitted to the second electrode wiring 220F connected to the first separation wiring VSSL1. The first switching transistor ST1 may receive a turn-off voltage from the gate voltage line VG connected to the scan driver SDR or may receive a turn-off voltage from an external alignment signal transmitting device. During the manufacturing process of the display device 10, the scan driver SDR may not be driven, and the first switching transistor ST1 may receive a separate turn-off voltage from an external device. However, the disclosure is not limited thereto.

During the manufacturing process of the display device 10, the first switching transistor ST1 may be turned off, and the light-emitting elements 300 may be independently aligned in each display area DPA through the first separation wiring VSSL1 or the second separation wiring VSSL2. Each of the separation wirings VSSL1 and VSSL2 may be connected to the second electrodes 220 disposed in their respective display areas DPA1 or DPA2 and may transmit an alignment signal only to the connected second electrodes 220. Since a pixel PX or subpixel PXn located far from the separation wirings VSSL1 and VSSL2 receives an alignment signal through the other separation wiring VSSL1 or VSSL2, it is possible to prevent a reduction in the strength of the alignment signal transmitted to the pixel PX far from the separation wiring VSSL1 or VSSL2. Therefore, during the manufacturing process of the display device 10, an alignment signal of uniform strength can be transmitted to the entire display area DPA, and an electric field of uniform strength can be formed in each pixel PX. It is possible to improve the degree of alignment of the light-emitting elements 300 disposed between the first and second electrodes 210 and 220 in the entire display area DPA.

According to an embodiment, the first switching transistor ST1 may be turned on while the display device 10 is being driven. Even if the first power supply voltage VSS is applied separately to each of the first separation wiring VSSL1 and the second separation wiring VSSL2, the first switching transistor ST1 disposed between them may be kept turned on, and the first power supply voltage VSS applied through each of the first separation wiring VSSL1 and the second separation wiring VSSL2 may have the same electric potential.

Referring to FIG. 10, the display device 10 may include a first type pixel PXa and a second type pixel PXb, in each of which the second electrode 220 of a light-emitting element 300 is electrically connected to the first switching transistor ST1. In the first type pixel PXa, the other end of a first light emitting diode EL1 may be electrically connected to the first source/drain electrode of the first switching transistor ST1 and the first separation wiring VSSL1 of the first voltage wiring VSSL. In the second type pixel PXb, the other end of a second light emitting diode EL2 may be connected to the second source/drain electrode of the first switching transistor ST1 and the second separation wiring VSSL2 of the first voltage wiring VSSL. The first light emitting diode EL1 may include the first electrode 210, the second electrode 220, and a first light-emitting element disposed between them in the first type pixel PXa. The second light emitting diode EL2 may include the first electrode 210, the second electrode 220, and a second light-emitting element disposed between them in the second type pixel PXb. For example, among the pixels disposed in the first display area DPA1, the first type pixel PXa may be a pixel PX or subpixel PXn in which the other end of the light emitting diode EL is electrically connected to the first switching transistor ST1. Among the pixels disposed in the second display area DPA2, the second type pixel PXb may be a pixel PX or subpixel PXn in which the other end of the light emitting diode EL is electrically connected to the first switching transistor ST1.

While the display device 10 is being driven, the first switching transistor ST1 may be turned on. Even if the first power supply voltage VSS is applied separately to each of the first separation wiring VSSL1 and the second separation wiring VSSL2 of the first voltage wiring VSSL, the first power supply voltages VSS applied to the other ends of the light emitting diodes EL1 and EL2 of the first type pixel PXa and the second type pixel PXb may have the same electric potential through the first switching transistor ST1. Accordingly, it is possible to prevent a difference in the brightness of a screen displayed in the first display area DPA1 and the second display area DPA2 of the display device 10.

A manufacturing process of the display device 10 will now be described in detail with reference to other drawings. The manufacturing process of the display device 10 will be described in detail below, but the structure and arrangement of members disposed in the display device 10, for example, the first electrodes 210, the second electrodes 220, the first voltage wiring VSSL, etc. will be briefly described.

Figure 11:
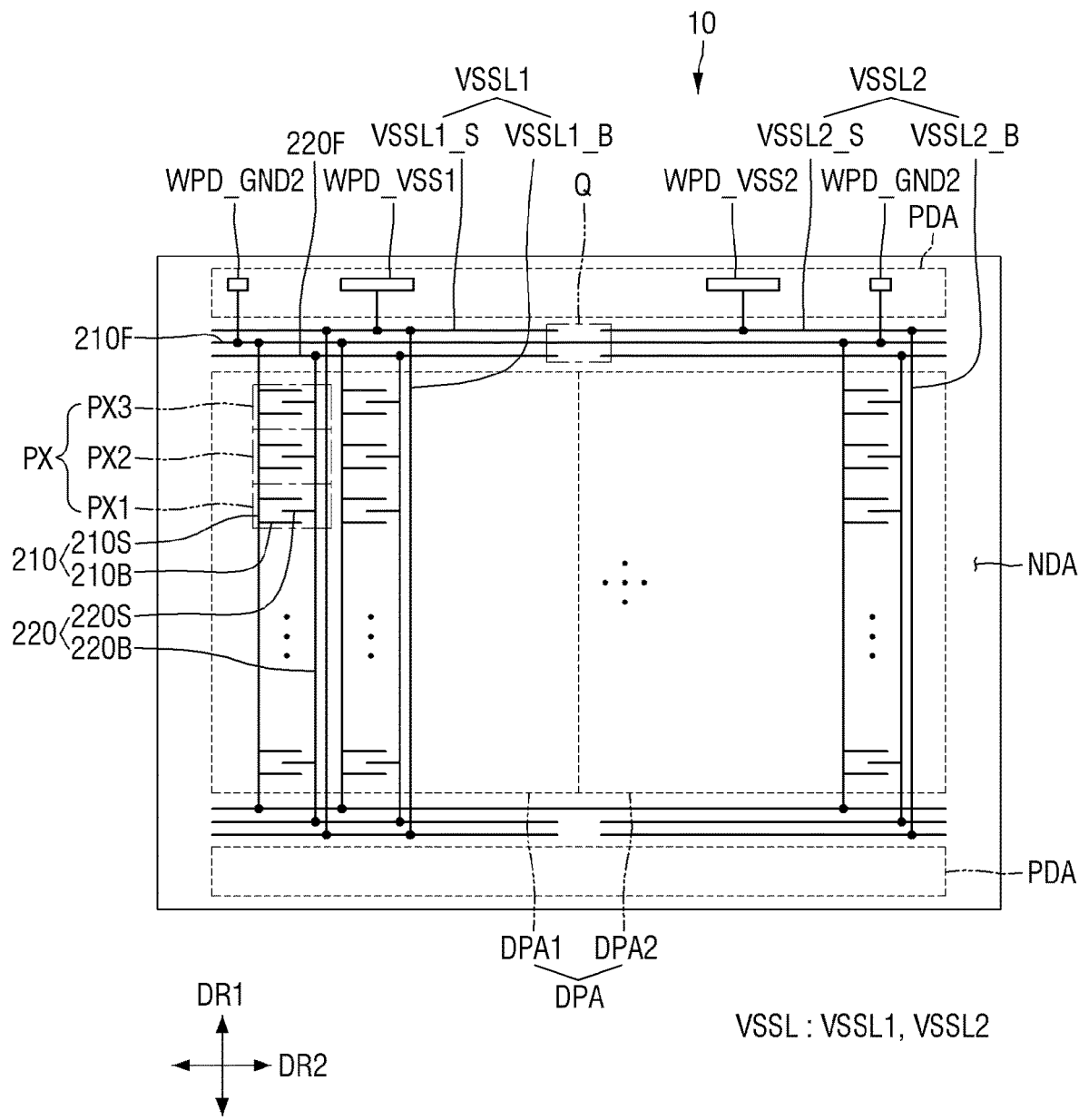
FIG. 11 is a schematic plan view illustrating an operation in a manufacturing process of the display device according to an embodiment.

FIG. 11 is a schematic plan view illustrating an operation in a manufacturing process of a display device according to an embodiment.

First, referring to FIG. 11, a substrate 110 and first electrodes 210, second electrodes 220 and a first voltage wiring VSSL formed on the substrate 110 are prepared. First transistors TR1, second transistors TR2, and insulating layers described above may be further disposed on the substrate 110 as described above. However, in the first electrodes 210 of FIG. 11, a first electrode stem part 210S of each subpixel PXn may be electrically connected to those of other subpixels PXn, may extend in the first direction DR1, and may be electrically connected to a first electrode wiring 210F. In the manufacturing process of the display device 10, the first electrodes 210 may be electrically connected to each other in the whole of a display area DPA and a non-display area NDA. As will be described below, the first electrode stem part 210S may be partially cut through a subsequent process so that the first electrode stem part 210S of each subpixel PXn is not connected to those of other subpixels PXn but remains as a floating line after the manufacturing process is completed.

In the drawing, the first electrode wiring 210F is disposed in the non-display area NDA and extends from a first display area DPA1 to a second display area DPA2 to cover them. However, the disclosure is not limited thereto. Similar to the second electrode wiring 220F, the first electrode wiring 210F may also include multiple wirings separated from each other. This will be described with reference to another example.

Figure 12:
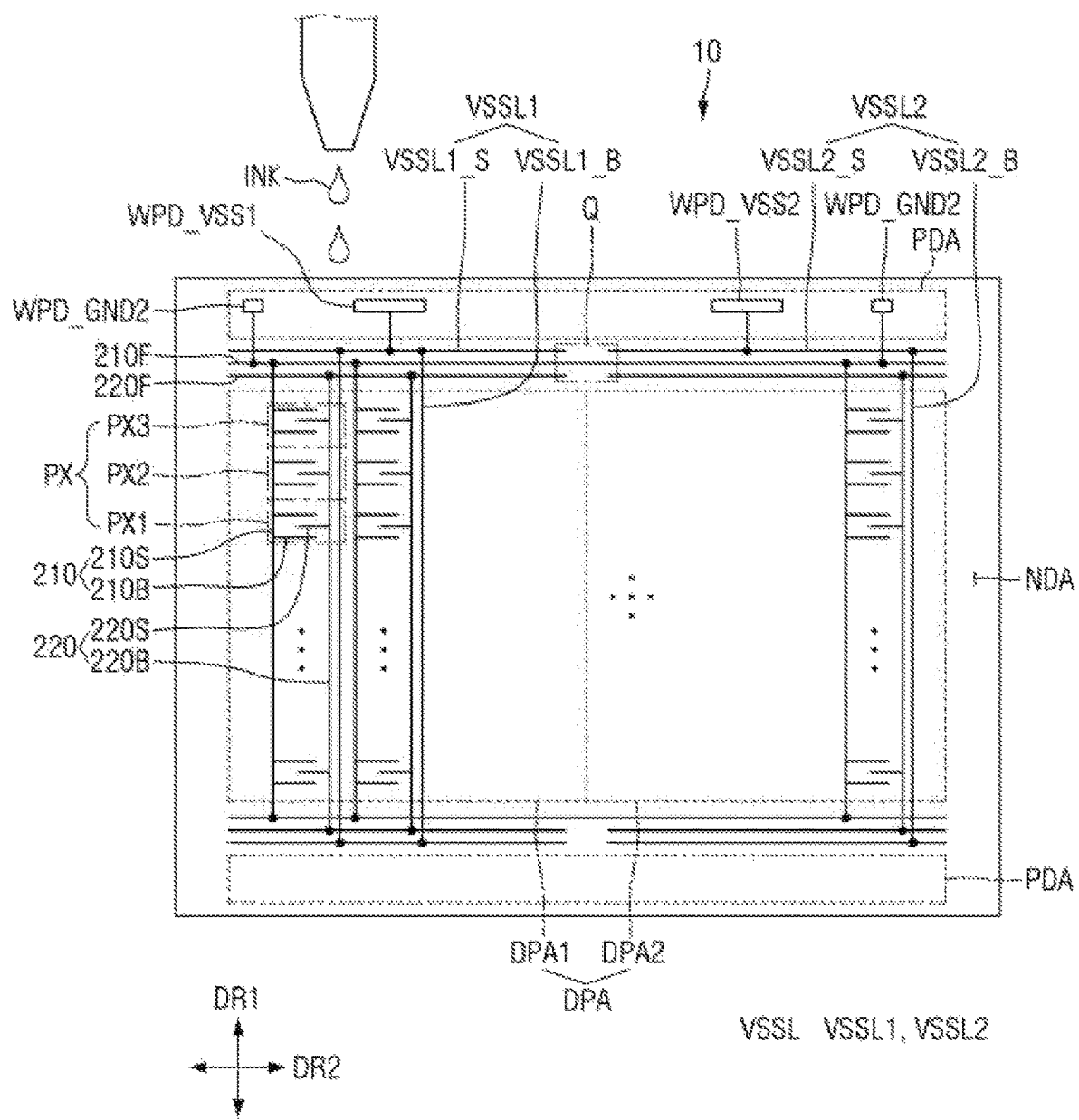
FIGS. 12 and 13 are schematic plan views illustrating an operation in a manufacturing process of the display device according to an embodiment.
Figure 13:
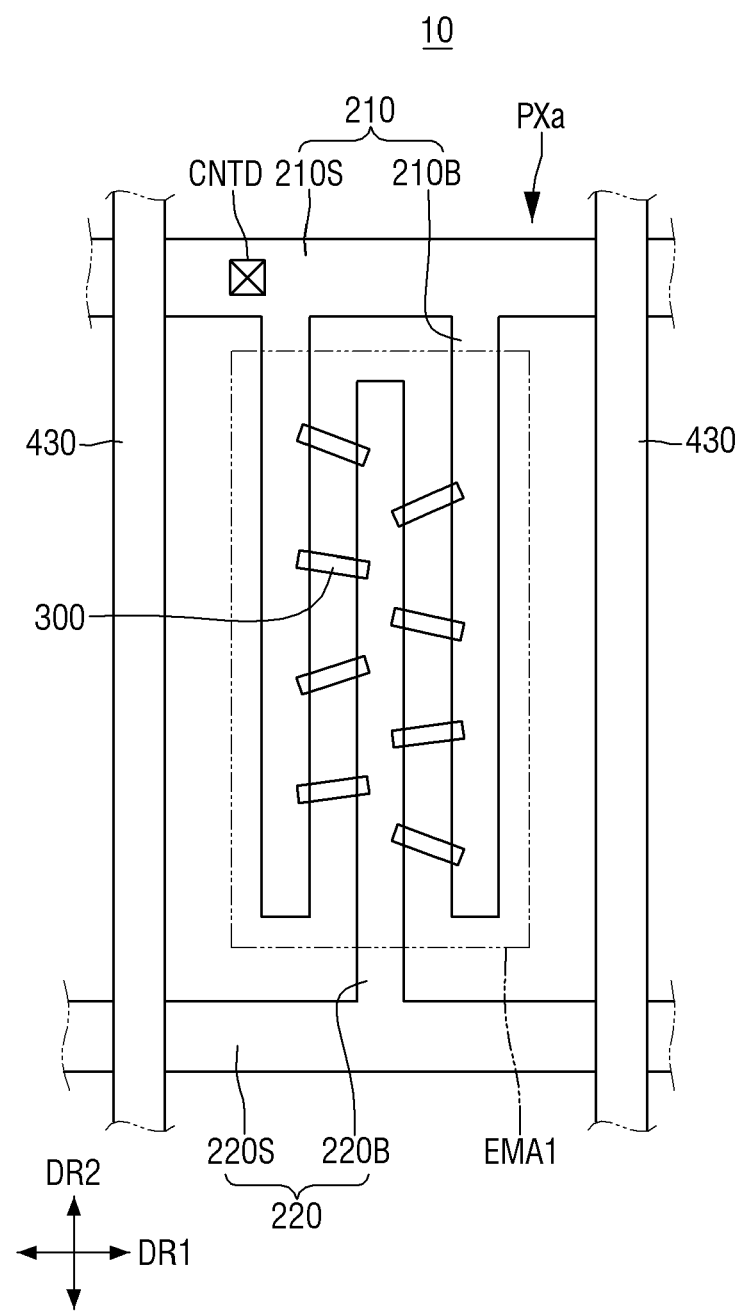

FIGS. 12 and 13 are schematic plan views illustrating an operation in the manufacturing process of the display device according to an embodiment. FIG. 13 is a schematic plan view of a first type pixel PXa disposed in the first display area DPA1 of FIG. 12.

Referring to FIGS. 12 and 13, ink in which light-emitting elements 300 are dispersed is sprayed onto the first electrodes 210 and the second electrodes 220 of the first display area DPA1. In an embodiment, in the display device 10, the light-emitting elements 300 may be sprayed onto the electrodes 210 and 220 using an inkjet printing method. The light-emitting elements 300 may be dispersed in the ink sprayed onto the first electrodes 210 and the second electrodes 220 and may have random orientation directions as illustrated in FIG. 13. When an alignment signal is transmitted to the first electrodes 210 and the second electrodes 220 in a subsequent process, the light-emitting elements 300 may be aligned between the first and second electrodes 210 and 220.

Figure 14:
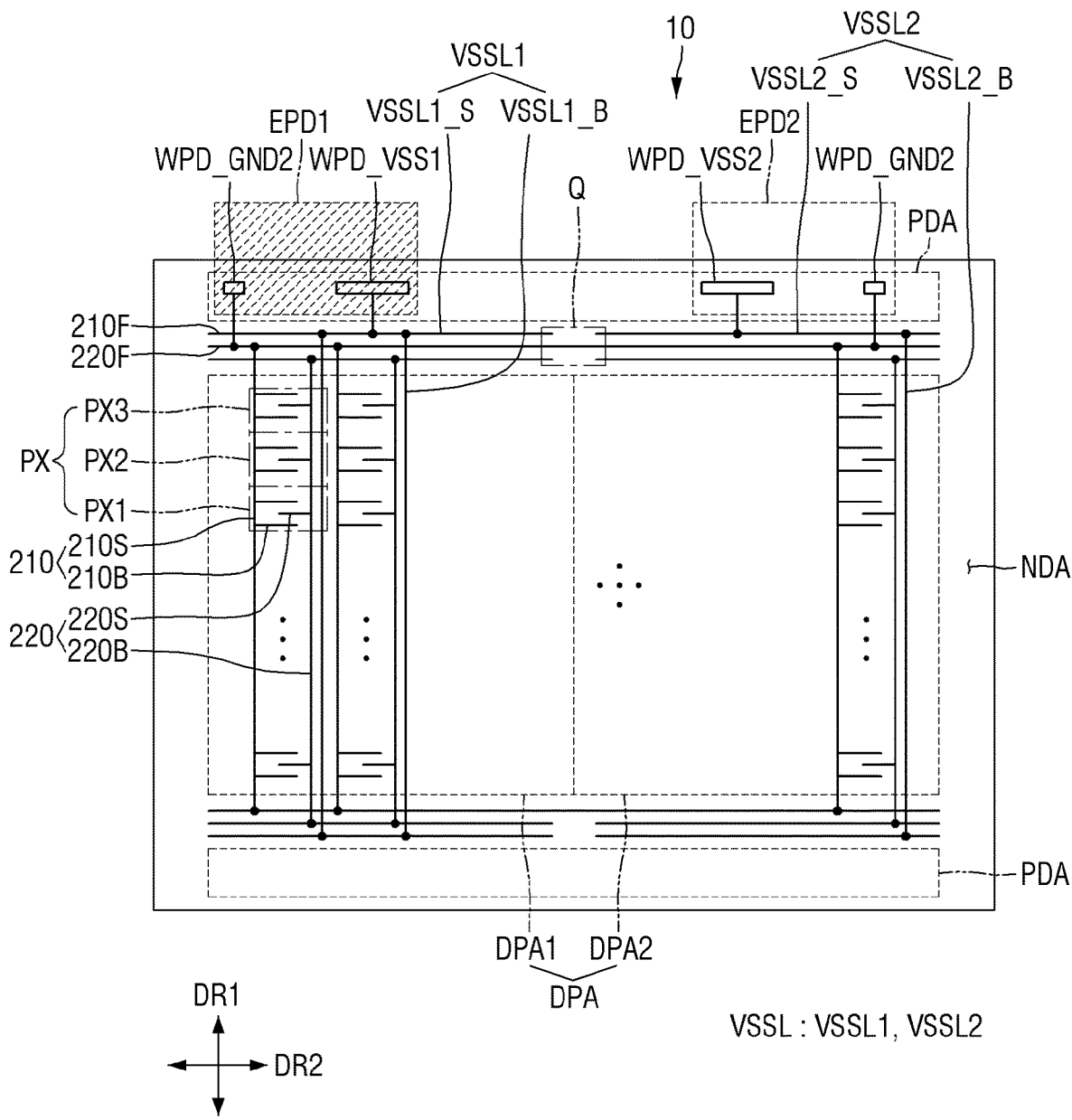
FIGS. 14 and 15 are schematic plan views illustrating an operation in a manufacturing process of the display device according to an embodiment.
Figure 15:
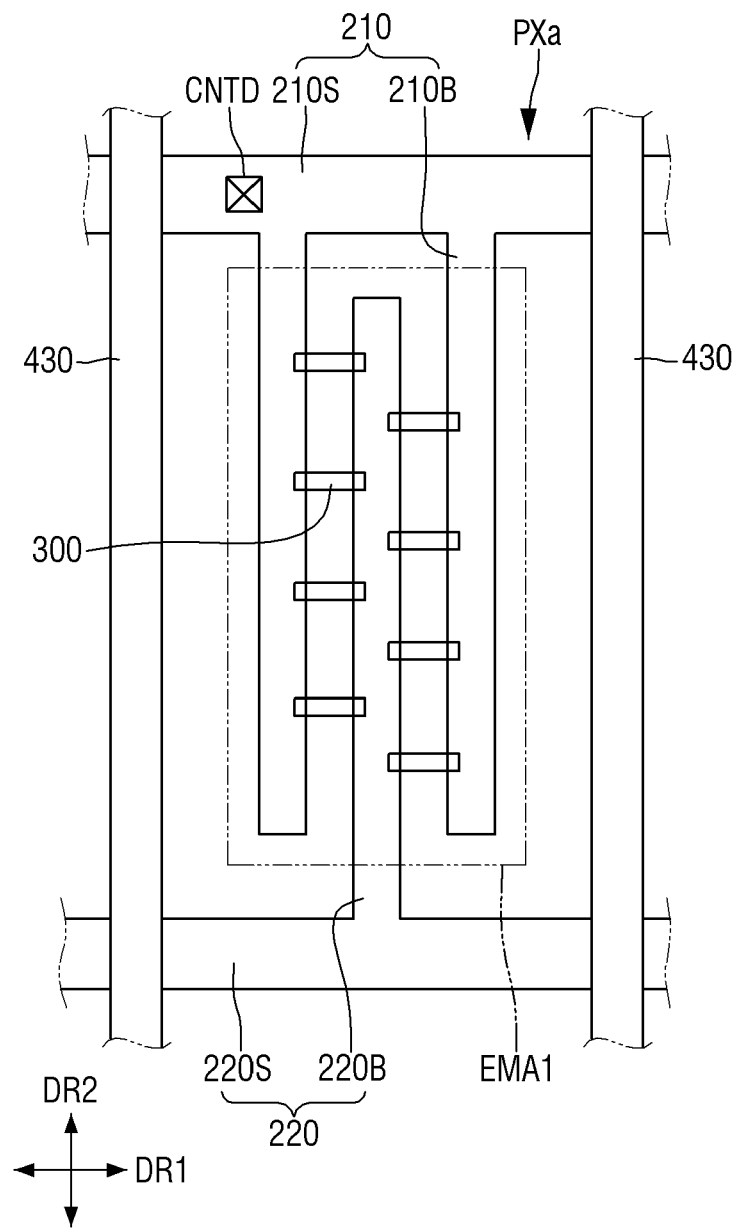

FIGS. 14 and 15 are schematic plan views illustrating operations in the manufacturing process of the display device according to an embodiment. FIG. 15 is a schematic plan view of a first type pixel PXa disposed in the first display area DPA1 of FIG. 14.

Referring to FIGS. 14 and 15, the light-emitting elements 300 are aligned by transmitting alignment signals to the first electrodes 210 and the second electrodes 220. The first electrodes 210 may receive a first alignment signal through the first electrode wiring 210F, and the second electrodes 220 may receive a second alignment signal through the second electrode wiring 220F or a second electrode stem part 220S. The second electrode wiring 220F or the second electrode stem part 220S may be electrically connected to a first separation wiring VSSL1 of the first voltage wiring VSSL, and the second alignment signal transmitted to the first separation wiring VSSL1 may be delivered to the second electrodes 220. For example, the first electrodes 210 may be grounded, and an alternating current (AC) voltage may be applied to the second electrodes 220. The AC voltage may have a voltage of about ±(10~50) V and a frequency of about 10 kHz to about 1 MHz. The first electrodes 210 may be grounded through a ground power pad WPD_GND1 to which the first electrode wiring 210F is electrically connected, and the second electrodes 220 may receive AC power through a (1-1)th power pad WPD_VSS1 to which the first separation wiring VSSL1 is electrically connected. FIGS. 14 and 15 illustrate the first manufacturing mode.

The alignment signals transmitted to the first electrodes 210 and the second electrodes 220 may be transmitted through an external alignment signal transmitting device (not illustrated). As illustrated in the drawings, ground power pads WPD_GND1 and WPD_GND2 and first power pads WPD_VSS1 and WPD_VSS2 disposed in a pad area PDA of the display device 10 may be electrically connected to alignment pads EPD1 and EPD2 of the alignment signal transmitting device. A first alignment pad EPD1 may be electrically connected to a first ground power pad WPD_GND1 and the (1-1)th power pad WPD_VSSL1 electrically connected to the first separation wiring VSSL1, and a second alignment pad EPD2 may be electrically connected to a second ground power pad WPD_GND2 and a (1-2)th power pad WPD_VSSL2 electrically connected to a second separation wiring VSSL2.

In the display device 10 according to the embodiment, since the first voltage wiring VSSL includes the separation wirings VSSL1 and VSSL2 separated from each other, an alignment signal can be independently transmitted to a part of the display area DPA. As illustrated in the drawings, when the alignment signal transmitting device transmits an alignment signal only to the first ground power pad WPD_GND1 and the (1-1)th power pad WPD_VSS1 through the first alignment pad EPD1, the alignment signal may be transmitted only to the first electrodes 210 and the second electrodes 220 disposed in the first display area DPA1. The alignment signal applying device may transmit an alignment signal in a selected range. When the strength of the alignment signal is weak, it cannot be transmitted to the entire display area DPA with uniform strength. However, when the alignment signal is transmitted only to a part of the display area DPA, for example, the first display area DPA1, it can be transmitted to at least the first display area DPA1 with uniform strength. Therefore, an electric field strong enough to align the light-emitting elements 300 can be formed in the entire first display area DPA1.

When an alignment signal is transmitted to the first electrodes 210 and the second electrodes 220, an electric field Ca (refer to FIG. 16) may be formed between the first and second electrodes 210 and 220. The light-emitting elements 300 dispersed in the ink may be placed between the first electrodes 210 and the second electrodes 220 as their orientation directions and positions are changed by a dielectrophoretic force due to the electric field Ca. As illustrated in FIG. 15, the light-emitting elements 300 may be aligned with a uniform orientation direction between the first and second electrodes 210 and 220.

While an AC voltage is applied through the (1-1)th power pad WPD_VSS1, a first switching transistor ST1 may be kept turned off. Even if the AC voltage is applied to the first separation wiring VSSL1, it may not be delivered to the second separation wiring VSSL2 because it does not flow through the turned-off first switching transistor ST1.

Figure 16:
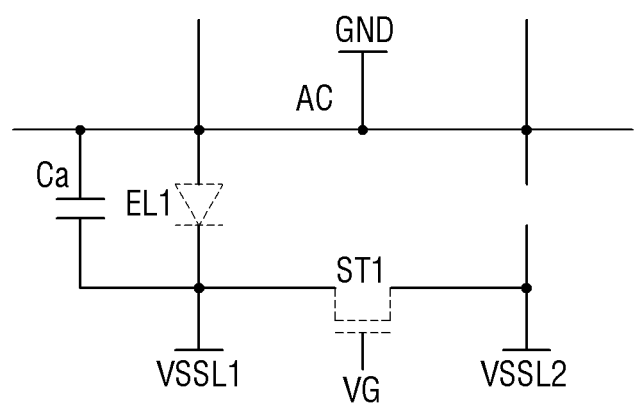
FIG. 16 is a schematic diagram of an equivalent circuit illustrating an operation of a first switching transistor in the operations illustrated in FIGS. 14 and 15.

FIG. 16 is a schematic diagram of an equivalent circuit illustrating the operation of the first switching transistor in the operation of FIGS. 14 and 15 in a first manufacturing mode. FIG. 16 illustrates a partial circuit diagram of a first type pixel PXa and a second type pixel PXb to schematically show an electric field may be formed in the first type pixel PXa according to an alignment signal. However, the second type pixel PXb may not receive the alignment signal and thus no electric field may be formed.

Referring to FIG. 16, an end of a first light emitting diode EL1 of the first type pixel PXa and an end of a second light emitting diode EL2 of the second type pixel PXb may be simultaneously grounded (GND in FIG. 16). During the manufacturing process of the display device 10, the first electrodes 210 may be connected to each other in the entire display area DPA through the first electrode wiring 210F. When the first electrode wiring 210F is grounded through the first ground power pad WPD_GND1, each of the first electrodes 210 disposed in the entire display area DPA may be grounded (GND).

When an alignment signal is transmitted through the first separation wiring VSSL1 of the first type pixel PXa, the electric field Ca due to an electric field may be formed between the grounded first electrode 210 of the first type pixel PXa and the second electrode 220 to which the alignment signal is transmitted. The light-emitting elements 300 in the ink sprayed onto the first electrode 210 and the second electrode 220 may be aligned by the electric field Ca. However, since the alignment signal transmitted through the first separation wiring VSSL1 is not delivered to the second electrode 220 of the second type pixel PXb through the first switching transistor ST1, an electric field due to an electric field is not formed in the second type pixel PXb.

Figure 17:
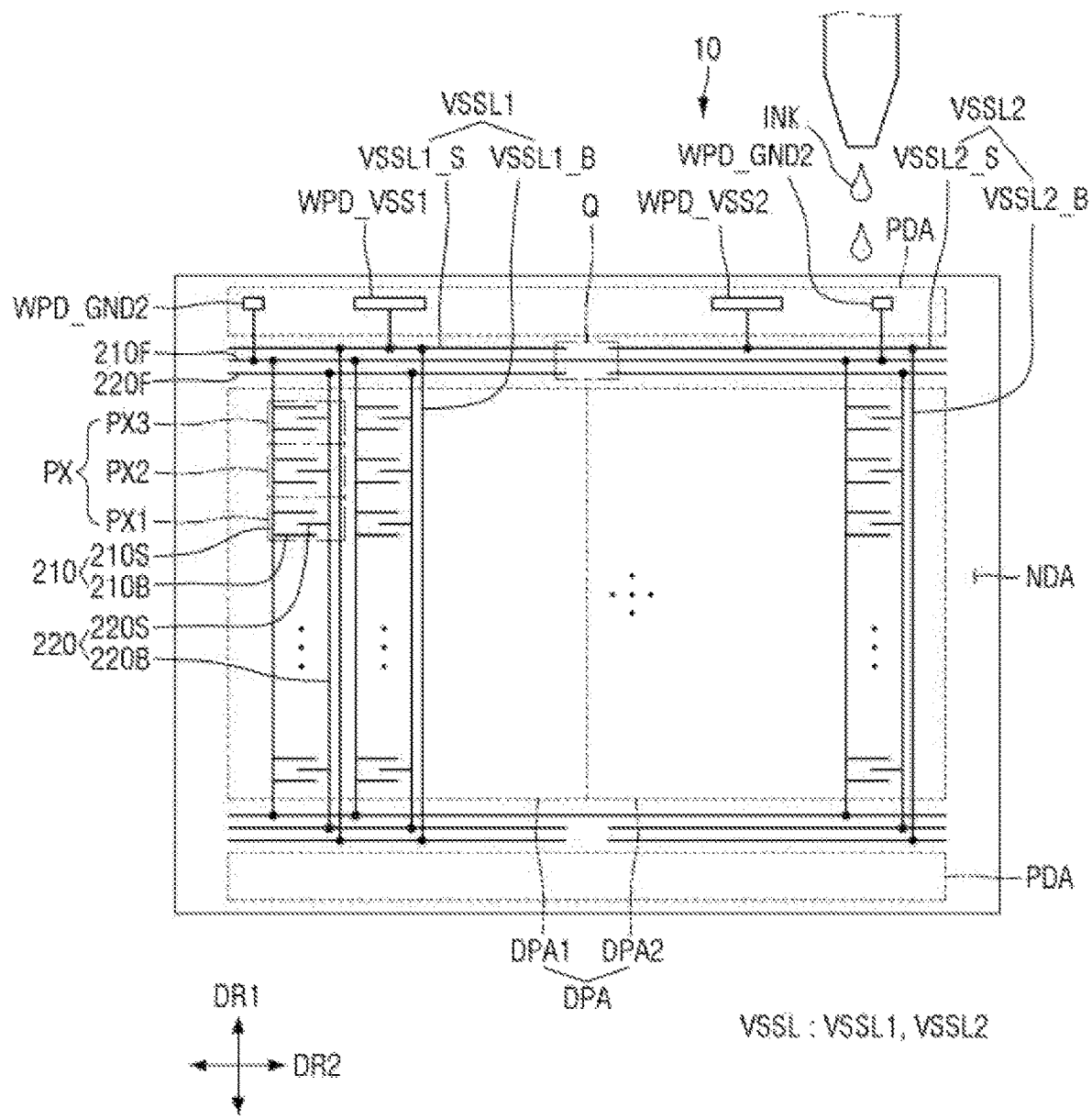
FIG. 17 is a schematic plan view illustrating an operation in the manufacturing process of the display device according to an embodiment.
Figure 18:
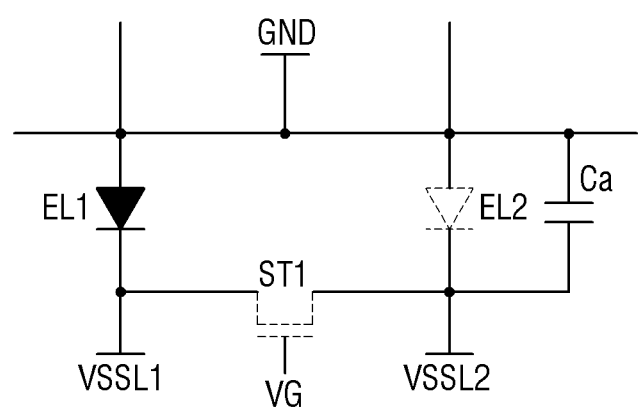
FIG. 18 is a schematic diagram of an equivalent circuit diagram illustrating an operation of the first switching transistor in the operation illustrated in FIG. 17.

FIG. 17 is a plan view illustrating an operation in the manufacturing process of the display device according to the embodiment. FIG. 18 is a schematic diagram of an equivalent circuit illustrating the operation of the first switching transistor in the operation of FIG. 17.

Referring to FIGS. 17 and 18, the ink in which the light-emitting elements 300 are dispersed is sprayed onto the first electrodes 210 and the second electrodes 220 of the second display area DPA2, and an alignment signal is transmitted to the first electrodes 210 and the second separation wiring VSSL2. Although not illustrated in the drawings, in this operation, the alignment signal may be transmitted only through the second alignment pad EPD2 of the alignment signal transmitting device and may be transmitted through the (1-2)th power pad WPD_VSS2 and the second ground power pad WPD_GND2. Accordingly, an electric field due to an electric field may be formed in the pixels PX or subpixels PXn disposed in the second display area DPA2, and the light-emitting elements 300 may be aligned between the electrodes 210 and 220 of the second display area DPA2. This may be referred to as the second manufacturing mode. The process of the second manufacturing mode is substantially similar to the first manufacturing mode as described above with reference to FIGS. 14 through 16, but applied to the second type pixels PXb. Referring to FIG. 18, t a light emitting diode EL1 has been formed in the first type pixels PXa, and an electric field Ca is formed in the second type pixels PXb, aligning the light-emitting elements to form a light-emitting diode EL2.

Figure 19:
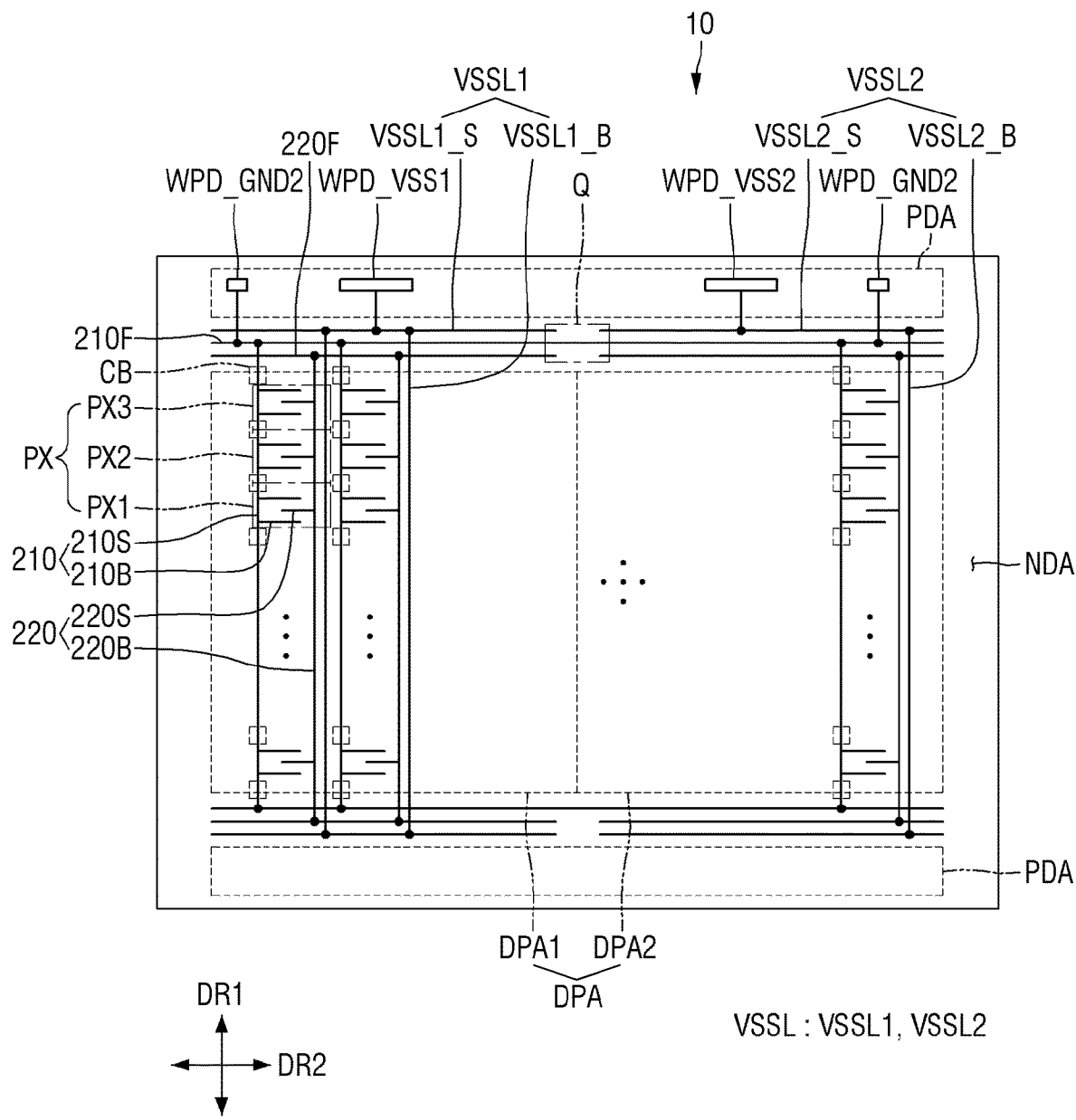
FIG. 19 is a schematic plan view illustrating an operation in the manufacturing process of the display device according to the embodiment.

FIG. 19 is a schematic plan view illustrating an operation in the manufacturing process of the display device according to an embodiment.

Referring to FIG. 19, a process of partially cutting the first electrode stem parts 210S is performed. As described above, since a first electrode stem part 210S is separated for each subpixel PXn, it may be partially cut (CB in FIG. 19) after the light-emitting elements 300 are aligned, so that the first electrode 210 of each subpixel PXn can independently receive a driving signal. In this operation, the first electrode wiring 210F may be electrically disconnected from the first electrode stem part 210S and may remain as a floating line in the non-display area NDA.

Although not illustrated in the drawing, a second insulating layer 520, contact electrodes 261 and 262, etc. disposed on the light-emitting elements 300 may be formed to manufacture the display device 10.

Hereinafter, display devices 10 and processes of manufacturing the same according to various embodiments will be described with reference to other drawings.

Figure 20:
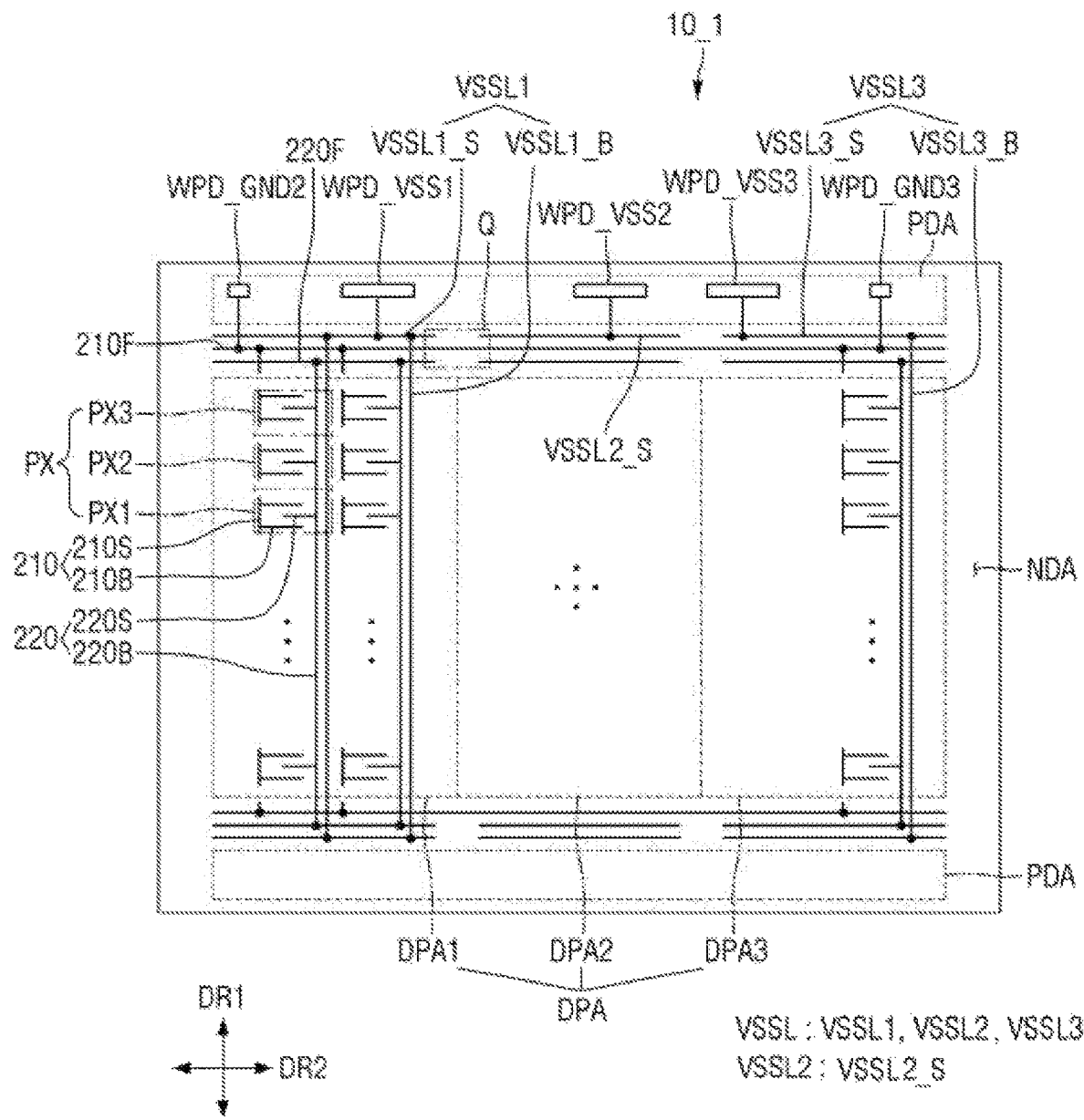
FIG. 20 is a schematic plan view illustrating the arrangement of electrodes and a first voltage wiring of a display device according to an embodiment.

FIG. 20 is a schematic plan view illustrating the arrangement of electrodes and a first voltage wiring of a display device according to an embodiment.

Referring to FIG. 20, in the display device 10_1 according to the embodiment, the first voltage wiring VSSL and a second electrode wiring 220F may include a larger number of wirings separated from each other. The current embodiment is different from the embodiment of FIG. 8 in that the first voltage wiring VSSL and the second electrode wiring 220F can be further divided. Therefore, redundant descriptions will be omitted, and differences will be mainly described below.

In the display device 10_1 of FIG. 20, a display area DPA may include a first display area DPA1, a second display area DPA2 and a third display area DPA3, and the second electrode wiring 220F may be separated at each part, where a boundary between the display areas DPA is located, to include multiple wirings spaced apart from each other. The first voltage wiring VSSL may include a first separation wiring VSSL1, a second separation wiring VSSL2 (the branch part VSSL2_B is not illustrated) and a third separation wiring VSSL3. The wiring stem parts VSSL1_S, VSSL2_S and VSSL3_S of the first separation wiring VSSL1, the second separation wiring VSSL2, and the third separation wiring VSSL3 may be spaced apart from each other, similar to the wirings of the second electrode wiring 220F.

In case that the display device 10_1 has a larger area by including a larger number of pixels PX, the area to which an alignment signal transmitted from an alignment signal transmitting device can be delivered with uniform strength as compared with the area of the display area DPA may be reduced. In display device 10_1, the first voltage wiring VSSL may be separated into a larger number of separation wirings VSSL1, VSSL2 and VSSL3, so that the alignment signal can be independently transmitted to each display area DPA. Therefore, even if the area of the display device 10_1 is increased, an alignment signal of uniform strength can be transmitted to each part of the display area DPA.

The first electrode wiring 210F is electrically disconnected from first electrode stem parts 210S during a manufacturing process of the display device 10 and is disposed in a non-display area NDA to remain as a floating line. During the manufacturing process of the display device 10, the first electrode wiring 210F may be connected to a first ground power pad WPD_GND1 and a second ground power pad WPD_GND2 and thus may be grounded. In other embodiments, like the second electrode wiring 220F, the first electrode wiring 210F may include multiple wirings separated from each other.

Figure 21:
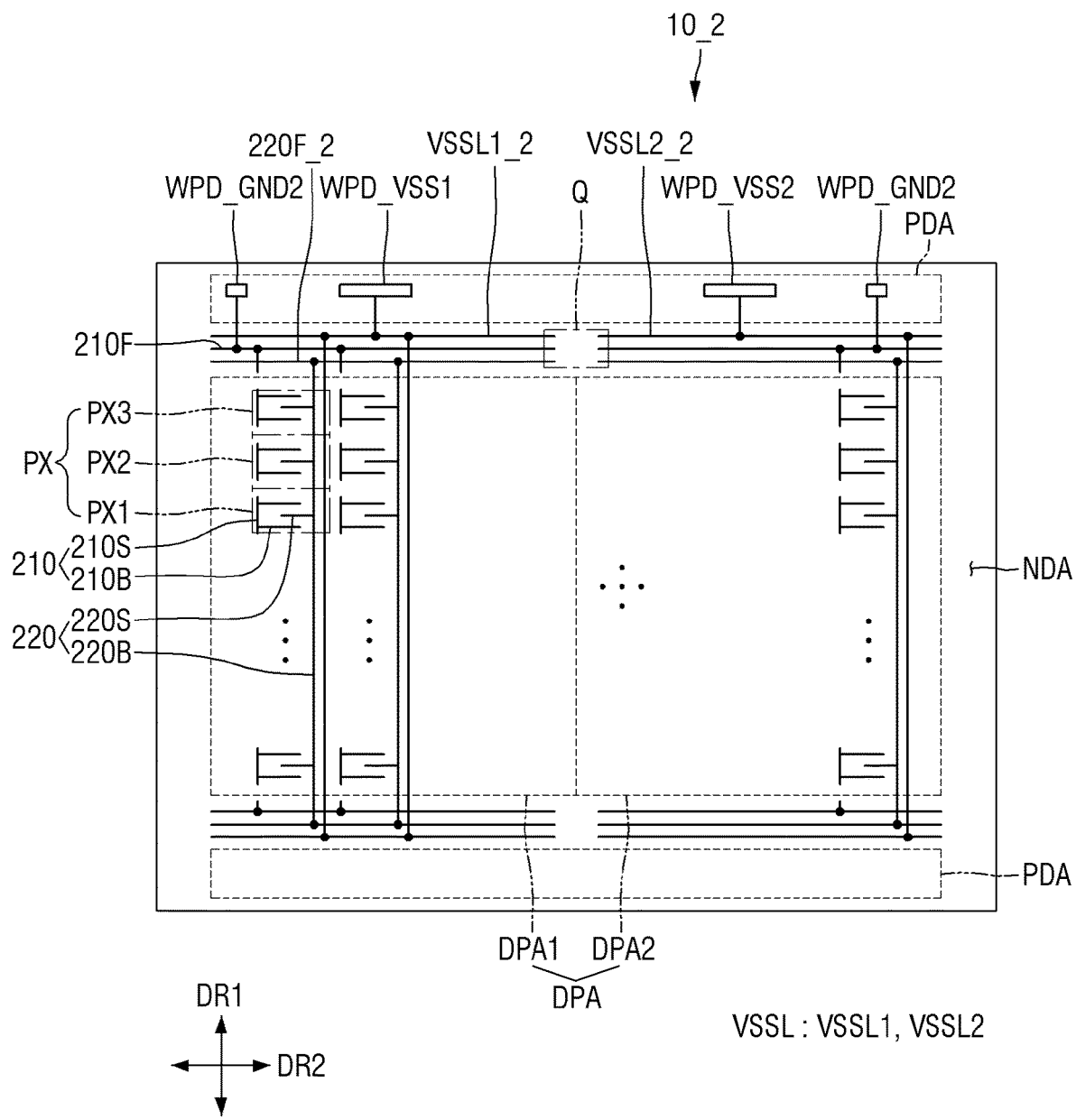
FIG. 21 is a schematic plan view illustrating the arrangement of electrodes and a first voltage wiring of a display device according to an embodiment.

FIG. 21 is a schematic plan view illustrating the arrangement of electrodes and a first voltage wiring of a display device according to an embodiment.

Referring to FIG. 21, in the display device 10_2 according to the embodiment, a first electrode wiring 210F includes multiple wirings separated from each other. The embodiment of FIG. 21 is different from the embodiment of FIG. 8 in that the first electrode wiring 210F includes multiple wirings. Therefore, redundant descriptions will be omitted, and differences will be described below.

In the display device 10_2 of FIG. 21, the first electrode wiring 210F which is an electrically floating line may be disposed in a non-display area NDA and may include multiple wirings separated from each other. While the display device 10_2 is being driven, an electrical signal may not be directly transmitted to the first electrode wiring 210F and may be transmitted only to first electrodes 210 disposed in a display area DPA. Accordingly, the first electrode wiring 210F may not be formed as a single wiring as illustrated in FIG. 8 but may include multiple separate wirings as illustrated in FIG. 21.

The first electrode wiring 210F may include multiple separate wirings during a manufacturing process of the display device 10_2, and each of the wirings may be grounded. The first electrode wiring 210F may include a wiring disposed between a first display area DPA1 and a pad area PDA and a wiring disposed between a second display area DPA2 and the pad area PDA, and these wirings may be spaced apart from each other, like those of a second electrode wiring 220F. The first electrode wiring 210F disposed between the first display area DPA1 and the pad area PDA may be connected to a first ground power pad WPD_GND1 and thus may be grounded. The first electrode wiring 210F disposed between the second display area DPA2 and the pad area PDA may be connected to a second ground power pad WPD_GND2 and thus may be grounded. While the display device 10_2 is being driven, since the first electrode wiring 210F is disposed as a floating line, it may not be formed as a single wiring but may include separate wirings. During the manufacturing process of the display device 10_2, the separate wirings of the first electrode wiring 210F_2 may be grounded from the ground power pads WPD_GND1 and WPD_GND2, respectively. In the embodiment, the first electrode wiring 210F may be disposed in substantially the same shape as the second electrode wiring 220F_2.

When a first electrode wiring 210F includes multiple separate wirings, a switching transistor may be further disposed between them.

Figure 22:
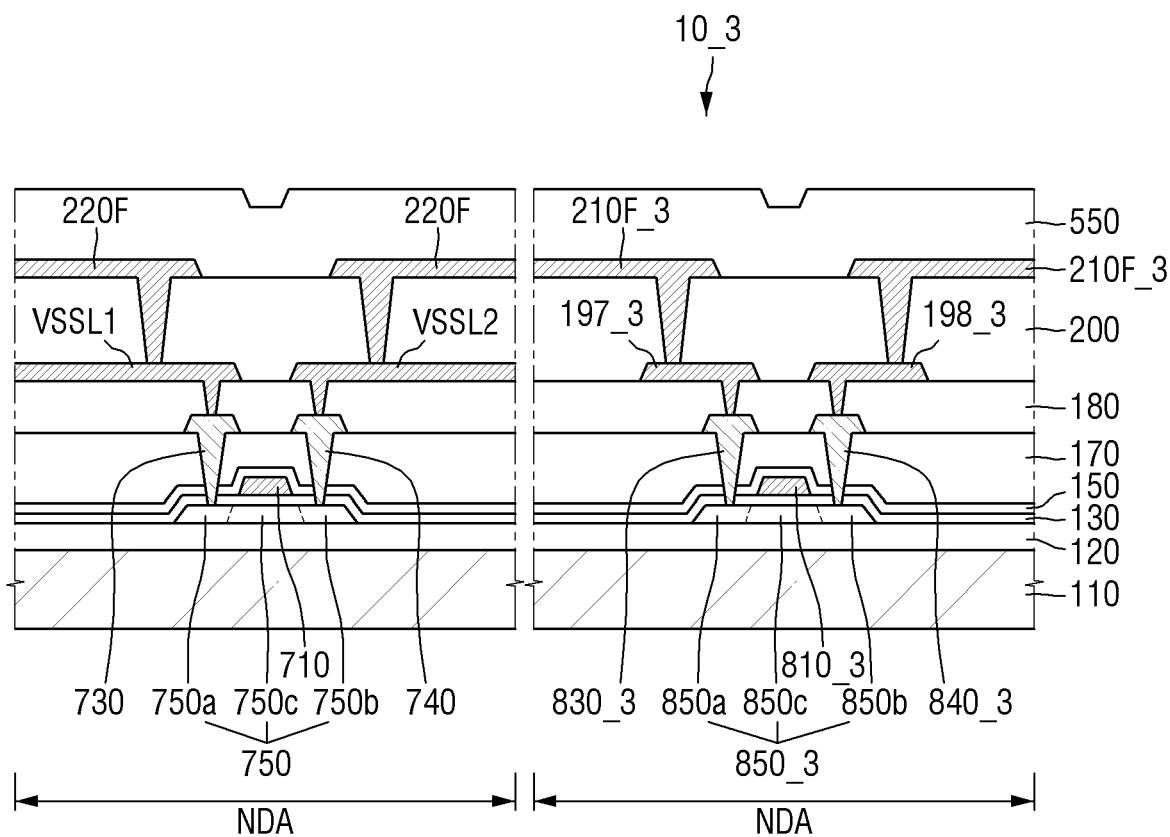
FIG. 22 is a schematic cross-sectional view of a part of a display device according to an embodiment.
Figure 23:
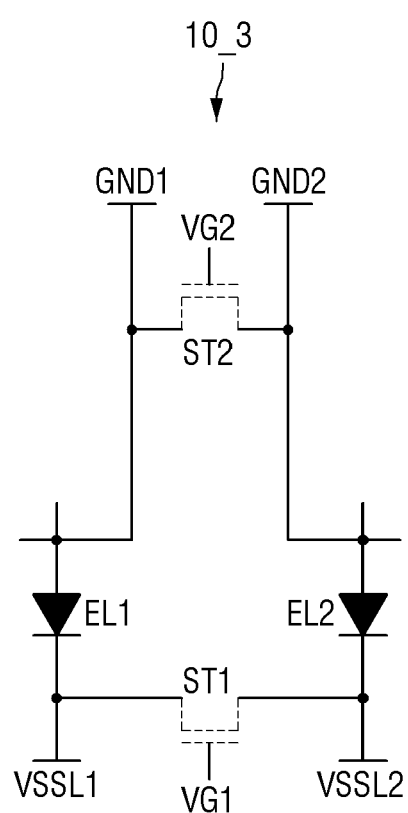
FIG. 23 is a schematic diagram of an equivalent circuit illustrating the operation of a first switching transistor and a second switching transistor during a manufacturing process of the display device of FIG. 22.

FIG. 22 is a cross-sectional view of a part of a display device according to an embodiment. FIG. 23 is a schematic circuit diagram illustrating the operation of a first switching transistor and a second switching transistor during a manufacturing process of the display device of FIG. 22.

FIG. 22 illustrates a part of a cross section of a part Q of FIG. 21 in the display device 10_3 according to the embodiment. Referring to FIG. 22, in the display device 10_3 according to the embodiment, a first electrode wiring 210F_3 may include multiple wirings separated from each other, and the second switching transistor ST2_3 disposed between them may be further included. The current example is different from the example of FIG. 10 in that it further includes the second switching transistor ST2_3 disposed in a non-display area NDA and electrically connected to the first electrode wirings 210F_3 separated from each other. Therefore, redundant descriptions will be omitted, and differences will be described below.

In the display device 10_3 of FIG. 22, as in the display device 10_2 of FIG. 21, the first electrode wiring 210F_3 may include multiple separate wirings as described in FIG. 21.

The first electrode wirings 210F_3 separated from each other may each be electrically connected to the second switching transistor ST2_3. The second switching transistor ST2_3 may be disposed in the non-display area NDA and may have source/drain electrodes connected to a second conductive pattern 197_3 and a third conductive pattern 198_3. The second switching transistor ST2_3 may have substantially the same structure as the first switching transistor ST1. For example, the second switching transistor ST2_3 includes a fourth active material layer 850_3, a fourth gate electrode 810_3, a first source/drain electrode 830_3, and a second source/drain electrode 840_3. The second switching transistor ST2_3 has the same structure as the first switching transistor ST1 except that the source/drain electrodes 830_3 and 840_3 are connected to the conductive patterns 197_3 and 198_3.

In the second switching transistor ST2_3, as in the first switching transistor ST1, the fourth gate electrode 810_3 may receive a turn-on or turn-off signal from a second gate voltage line VG2 connected to a scan driver SDR. A turn-on voltage may be applied to the second gate voltage line VG2 while the display device 10 is being driven, and a turn-off voltage may be applied to the second gate voltage line VG2 during the manufacturing process. This is the same as the first switching transistor ST1, and thus a detailed description thereof will be omitted.

A second data conductive layer may be disposed in the non-display area NDA and may further include the second conductive pattern 197_3 and the third conductive pattern 198_3 connected to the source/drain electrodes of the second switching transistor ST2_3. The second conductive pattern 197_3 may be connected to the first source/drain electrode 830_3 of the second switching transistor ST2_3, and the third conductive pattern 198_3 may be connected to the second source/drain electrode 840_3 of the second switching transistor ST2_3. The second conductive pattern 197_3 and the third conductive pattern 198_3 may be respectively connected to the first electrode wirings 210F_3 separated from each other.

Referring to FIG. 23, like the first switching transistor ST1, the second switching transistor ST2 according to an embodiment may be kept turned off during the manufacturing process of the display device 10 and may be kept turned on during driving of the display device 10. During the manufacturing process of the display device 10_3, the first electrode wirings 210F_3 are electrically connected to first electrodes 210 of a display area DPA. When alignment signals are individually transmitted to a first display area DPA1 and a second display area DPA2 through a first separation wiring VSSL1 and a second separation wiring VSSL2, the first electrodes 210 may also be individually grounded. For example, when the first electrode wiring 210F_3 connected to a first ground power pad WPD_GND1 is grounded (GND1 in FIG. 23), the first electrode wiring 210F_3 connected to a second ground power pad WPD_GND2 may not be grounded or may be individually grounded (GND2 in FIG. 23) through the second ground power pad WPD_GND2. Accordingly, alignment signals may be individually transmitted to the first display area DPA1 and the second display area DPA2 respectively through the separation wirings VSSL1 and VSSL2 and the first electrode wirings 210F_3 separated from each other, and light-emitting elements 300 may be independently aligned in each display area DPA.

Although not illustrated in the drawings, the second switching transistor ST2 may be kept turned on while the display device 10_3 is being driven. However, the disclosure is not limited thereto. Since the first electrode wirings 210F_3 can remain as floating lines, the second switching transistor ST2 may also be kept turned off even while the display device 10_3 is being driven.

In other examples, a second electrode wiring 220F may not include separate wirings but may be formed as a single wiring.

Figure 24:
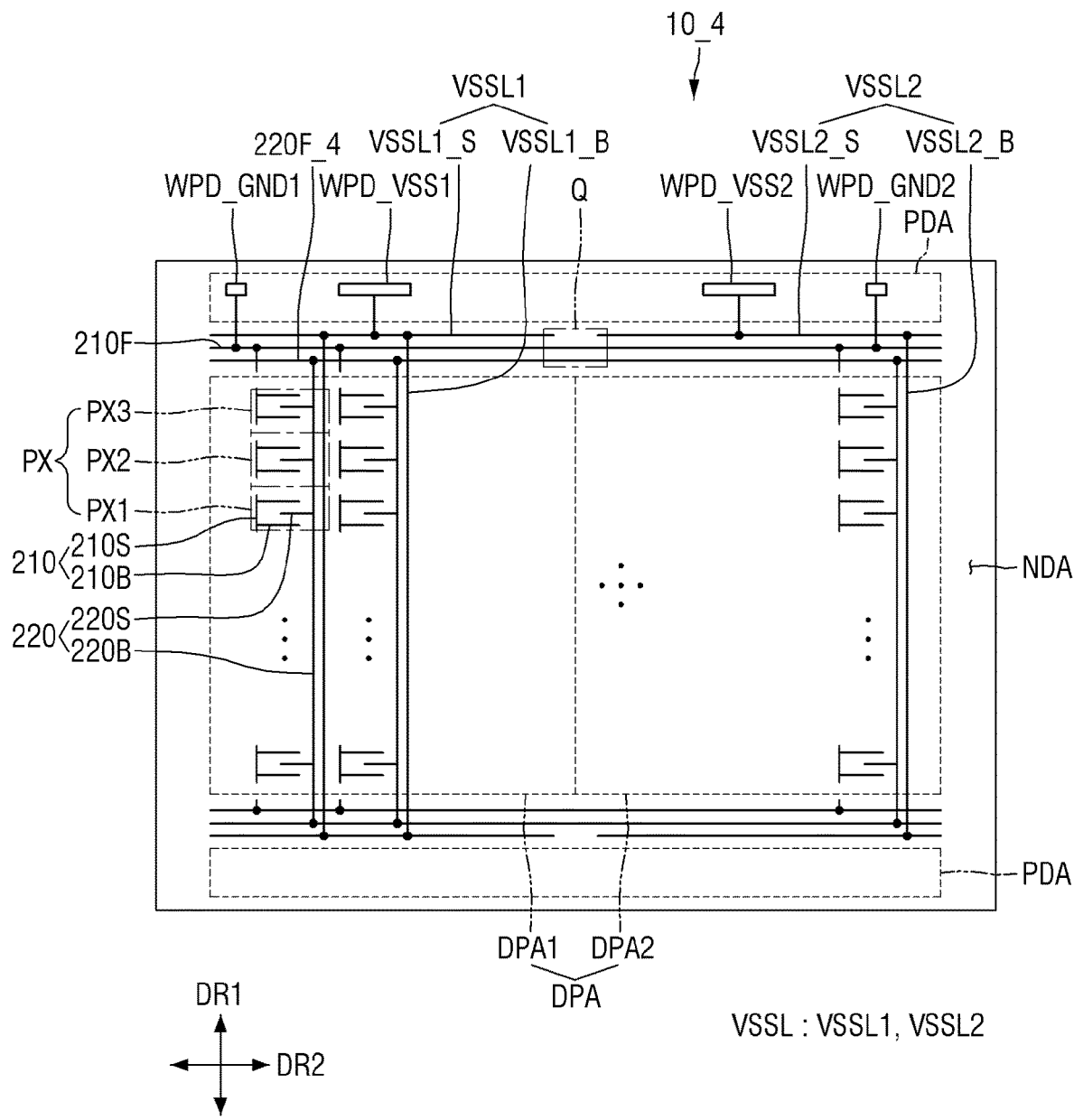
FIG. 24 is a schematic plan view illustrating the arrangement of electrodes and a first voltage wiring of a display device according to an embodiment.

FIG. 24 is a schematic plan view illustrating the arrangement of electrodes and a first voltage wiring of a display device according to another example.

Referring to FIG. 24, in the display device 10_4 according to the embodiment, a second electrode wiring 220F_4 may not include separate wirings but may be a single connected wiring. The current embodiment is different from the embodiment of FIG. 8 in that the second electrode wiring 220F_4 is a single connected wiring. Therefore, redundant descriptions will be omitted, and differences will be described below.

During a manufacturing process of the display device 10_4, a first voltage wiring VSSL to which an alignment signal is transmitted may be electrically connected to the second electrode wiring 220F_4 or second electrodes 220. The first voltage wiring VSSL may include a first separation wiring VSSL1 and a second separation wiring VSSL2, and an alignment signal may be individually transmitted to each of them. When an alignment signal is transmitted to the first separation wiring VSSL1, it may be transmitted with strong strength to the second electrodes 220 and the second electrode wiring 220F_4 disposed adjacent and electrically connected to the first separation wiring VSSL1. However, as for the second electrodes 220 and the second electrode wiring 220F_4 located far from the first separation wiring VSSL1, the strength of the alignment signal may be reduced by the resistance of the electrodes and the wiring.

Even if the second electrode wiring 220F_4 does not include multiple separate wirings, an alignment signal may not be transmitted to the second electrodes 220 far from the second electrode wiring 220F_4 due to the resistance of the second electrode wiring 220F_4. Accordingly, an alignment signal may be individually transmitted to the second electrodes 220 by the first separation wiring VSSL1 and the second separation wiring VSSL2. In the display device 10_4 according to the embodiment, even if the second electrode wiring 220F_4 is disposed as a single wiring without being separated, an alignment signal can be individually transmitted to each of a first display area DPA1 and a second display area DPA2.

The second electrode 220 may be electrically connected to the first voltage wiring VSSL through a second electrode contact hole CNTS in each pixel PX or subpixel PXn (refer to FIG. 6). Like the first electrode 210, the second electrode 220 may also include a separate second electrode stem part 220S for each pixel PX or subpixel PXn.

Figure 25:
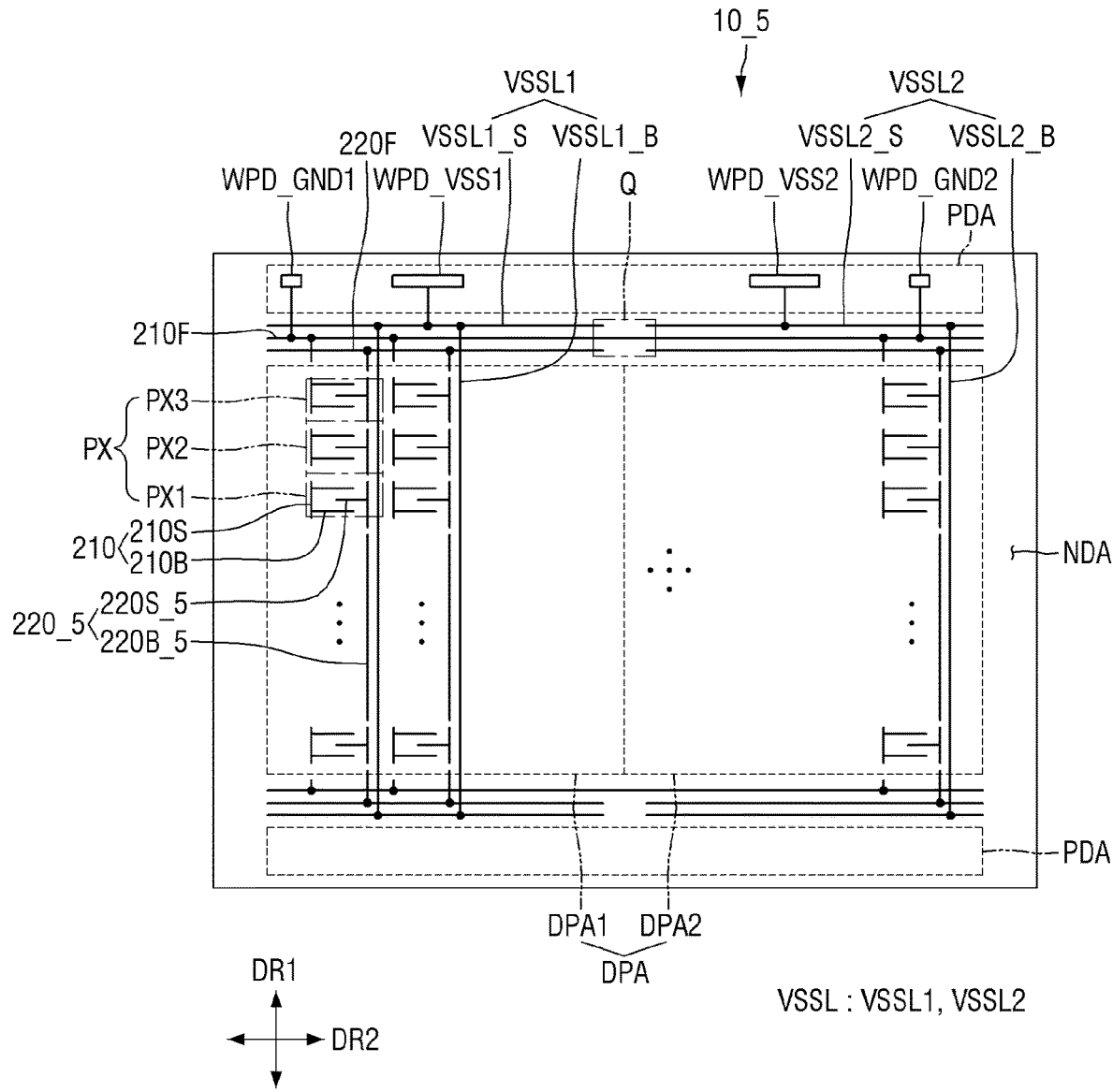
FIG. 25 is a schematic plan view illustrating the arrangement of electrodes and a first voltage wiring of a display device according to an embodiment.
Figure 26:
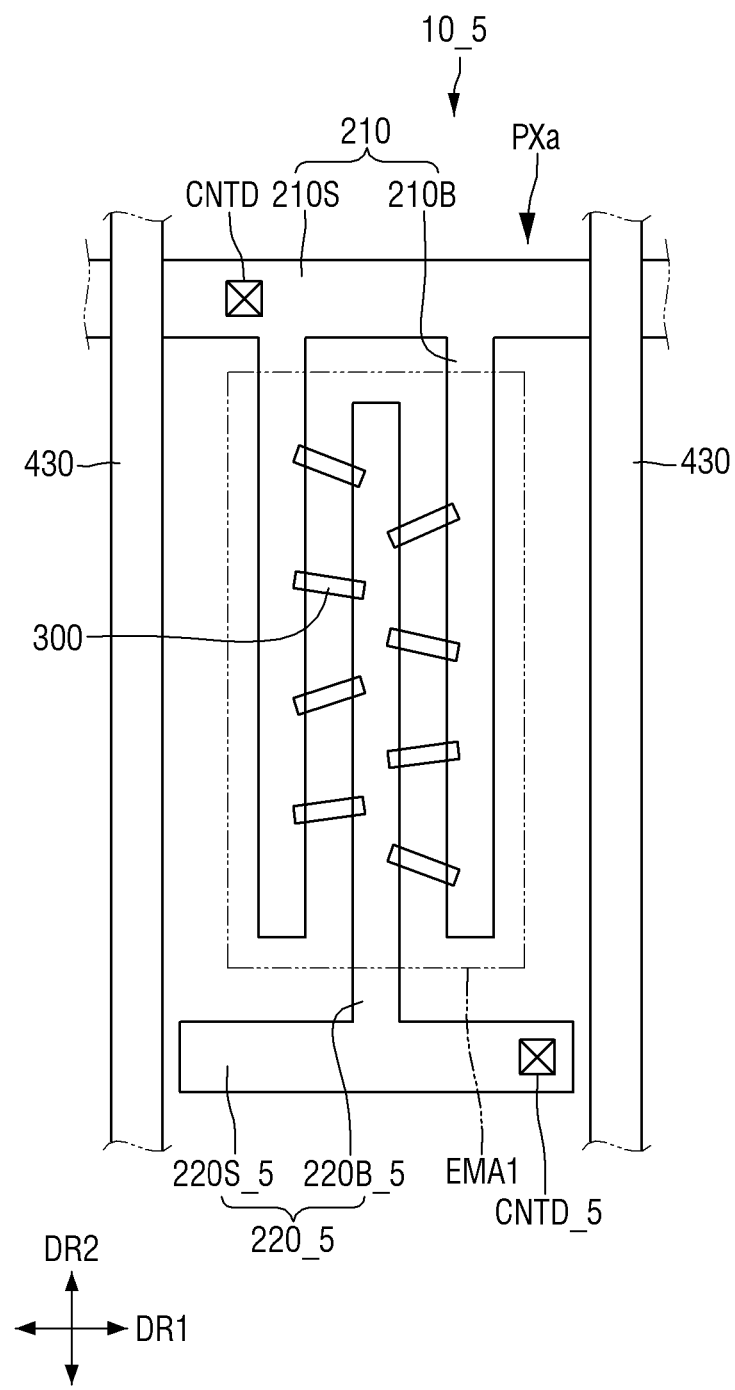
FIG. 26 is a schematic plan view illustrating an operation in a manufacturing process of the display device of FIG. 25.

FIG. 25 is a schematic plan view illustrating the arrangement of electrodes and a first voltage wiring of a display device according to an embodiment. FIG. 26 is a schematic plan view illustrating an operation in a manufacturing process of the display device of FIG. 25.

Referring to FIGS. 25 and 26, in the display device 10_5 according to the embodiment, second electrode stem parts 220S_5 of second electrodes 220_5 may extend in a single direction but may be spaced apart from each other at the boundary of each subpixel PXn. The current embodiment is different from the embodiment of FIGS. 5 and 8 in that the second electrode stem parts 220S_5 separated from each other are disposed in the subpixels PXn, respectively. Therefore, redundant descriptions will be omitted, and differences will be described below.

In the display device 10_5 of FIGS. 25 and 26, the second electrode stem part 220S_5 may be disposed separately in each subpixel PXn. The second electrodes 220_5 may have a structure substantially similar to that of first electrodes 210, and electrical signals may be individually transmitted to the first electrode 210 and the second electrode 220_5 disposed in each subpixel PXn. A second electrode contact hole CNTS_5 may be formed in the second electrode stem part 220S_5 disposed in each subpixel PXn, and the second electrode 220_5 may be electrically connected to a first voltage wiring VSSL in each subpixel PXn. A second electrode wiring 220F_5 disposed in a non-display area NDA may be a floating line, like a first electrode wiring 210F.

The second electrodes 220_5 may be disposed in a state in which the second electrode stem parts 220S_5 are separated from each other during the manufacturing process of the display device 10_5. As illustrated in FIG. 26, the second electrode stem parts 220S_5 may be separated from each other at the boundary of each subpixel PXn and may be electrically connected to the first voltage wiring VSSL or separation wirings VSSL1 and VSSL2 through the second electrode contact holes CNTS_5. When an alignment signal is transmitted to a first separation wiring VSSL1, it may be transmitted to the second electrode 220_5 of each subpixel PXn disposed in a first display area DPA1. Since the second electrodes 220_5 disposed in a second display area DPA2 are connected only to a second separation wiring VSSL2, the alignment signal may not be transmitted to them. Other details are substantially the same as those described above.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a display area;
a non-display area surrounding the display area;
pixels disposed in the display area, each of the pixels comprising:
a first electrode;
a second electrode; and
light-emitting elements electrically connected to the first electrode and to the second electrode; and
a first voltage wiring disposed in the display area and in the non-display area, the first voltage wiring electrically connected to at least some of the pixels,
wherein
the first voltage wiring includes:
a first separation wiring disposed in the non-display area; and
a second separation wiring disposed in the non-display area, and spaced apart from the first separation wiring.

2. The display device of claim 1, wherein
the display area comprises:
a first display area; and
a second display area,
the first separation wiring comprises:
a first wiring stem part disposed in the non-display area and extending in a first direction; and
a first wiring branch part branching from the first wiring stem part in a second direction and disposed in the first display area, and
the second separation wiring comprises:
a second wiring stem part disposed in the non-display area and extending in the first direction; and
a second wiring branch part branching from the second wiring stem part in the second direction and disposed in the second display area.

3. The display device of claim 2, further comprising:
a first switching transistor disposed between the first wiring stem part and the second wiring stem part, wherein
the first wiring stem part and the second wiring stem part are spaced apart from each other in the non-display area.

4. The display device of claim 3, wherein the first switching transistor includes:
a first source/drain electrode electrically connected to the first separation wiring; and
a second source/drain electrode electrically connected to the second separation wiring.

5. The display device of claim 4, wherein the first switching transistor is turned on in a driving mode of the display device and is turned off in a manufacturing mode of the display device.

6. The display device of claim 3, further comprising:
a second electrode wiring disposed in the non-display area, the second electrode wiring extending in the second direction,
wherein the second electrodes of the pixels extend in the second direction and are electrically connected to the second electrode wiring.

7. The display device of claim 6, wherein the second electrode wiring comprises wirings separated from each other in the non-display area.

8. The display device of claim 7, wherein the wirings are electrically connected to the first switching transistor.

9. The display device of claim 2, wherein
the first wiring branch part is electrically connected to the second electrodes of the pixels disposed in the first display area, and
the second wiring branch part is electrically connected to the second electrodes of the pixels disposed in the second display area.

10. The display device of claim 2, further comprising:
first electrode wiring disposed in the non-display area, the first electrode wiring extending in the first direction,
wherein the first electrode disposed in each of the pixels is not electrically connected to the first electrode wiring.

11. The display device of claim 2, further comprising:
a pad area disposed in the non-display area, wherein
the first separation wiring is electrically connected to a first power pad disposed in the pad area, and
the second separation wiring is electrically connected to a second power pad disposed in the pad area.

12. A display device comprising:
pixels, each of the pixels comprising:
a first electrode;
a second electrode; and
light-emitting elements disposed between the first electrode and the second electrode;
a first voltage wiring comprising:
a first separation wiring; and
a second separation wiring, the first separation wiring and the second separation wiring separated from each other; and
a first switching transistor disposed between the first separation wiring and the second separation wiring, the first switching transistor including source/drain electrodes electrically connected to the first separation wiring and the second separation wiring, respectively,
wherein the pixels comprise:
a first type pixel in which the second electrode is electrically connected to the first separation wiring, and
a second type pixel in which the second electrode is electrically connected to the second separation wiring.

13. The display device of claim 12, wherein
in a first manufacturing mode, the first switching transistor is turned off,
in the first manufacturing mode, an alignment signal is transmitted to the first separation wiring and to the second electrode of the first type pixel, and
in the first manufacturing mode, the alignment signal is not transmitted to the second separation wiring and is not transmitted to the second electrode of the second type pixel.

14. The display device of claim 13, wherein
in a second manufacturing mode, the first switching transistor is turned off,
in the second manufacturing mode, the alignment signal is transmitted to the second separation wiring and to the second electrode of the second type pixel, and
in the second manufacturing mode, the alignment signal is not transmitted to the first separation wiring and is not transmitted to the second electrode of the first type pixel.

15. The display device of claim 14, wherein
in a driving mode, the first switching transistor is turned on,
in the driving mode, a power supply voltage is transmitted to the first separation wiring and to the second electrode of the first type pixel, and
in the driving mode the power supply voltage is transmitted to the second separation wiring, and to the second electrode of the second type pixel.

16. A method for manufacturing a display device, the method comprising:
preparing a first voltage wiring on a substrate, the first voltage wiring including a first separation wiring and a second separation wiring that each receive a first alignment signal, a first electrode that receives a second alignment signal, and second electrodes, each of the second electrodes electrically connected to the first separation wiring, or to the second separation wiring;
aligning a first light-emitting element between the first electrode and one of the second electrodes electrically connected to the first separation wiring by transmitting the first alignment signal to the first separation wiring; and
aligning a second light-emitting element between the first electrode and one of the second electrodes electrically connected to the second separation wiring by transmitting the first alignment signal to the second separation wiring.

17. The method of claim 16, wherein
the first separation wiring is disposed in a first display area of the display device, and
the second separation wiring is disposed in a second display area of the display device.

18. The method of claim 17, wherein
the first light-emitting element is aligned between the first electrode and one of the second electrodes disposed in the first display area of the display device, and
the second light-emitting element is aligned between the first electrode and one of the second electrodes disposed in the second display area of the display device.

19. The method of claim 18,
further comprising:
preparing a first switching transistor which has source/drain electrodes electrically connected to the first separation wiring and the second separation wiring, respectively,
wherein the first separation wiring and the second separation wiring are spaced apart from each other.

20. The method of claim 19, wherein the first switching transistor is turned off in the aligning of the first light-emitting element and in the aligning of the second light-emitting element.

* * * * *